US007205831B2

(12) United States Patent
Shinichi

(10) Patent No.: US 7,205,831 B2

(45) Date of Patent: Apr. 17, 2007

(54) NOISE FILTER CIRCUIT

(75) Inventor: Akita Shinichi, Toshima-ku (JP)

(73) Assignee: Nanopower Solution Co., Ltd., Tokyo (JP)

( * ) Notice: Subject to any disclaimer, the term of this patent is extended or adjusted under 35 U.S.C. 154(b) by 88 days.

(21) Appl. No.: 10/512,102

(22) PCT Filed: Feb. 17, 2003

(86) PCT No.: PCT/JP03/01655

§ 371 (c)(1),
(2), (4) Date: Oct. 21, 2004

(87) PCT Pub. No.: WO03/091817

PCT Pub. Date: Nov. 6, 2003

(65) Prior Publication Data

US 2005/0156663 A1 Jul. 21, 2005

(30) Foreign Application Priority Data

Apr. 23, 2002 (JP) ............................. 2002-121231

(51) Int. Cl.
*H03K 5/00* (2006.01)

(52) U.S. Cl. ...................... 327/551; 327/552; 327/531; 327/532

(58) Field of Classification Search ........ 327/551–559, 327/531–532
See application file for complete search history.

(56) References Cited

U.S. PATENT DOCUMENTS 4,327,319 A 4/1982 Swisher et al.
4,533,877 A 8/1985 Rahim
4,594,648 A * 6/1986 Gallios ......................... 363/46
5,113,148 A 5/1992 Theus
5,130,579 A 7/1992 Thomas
5,552,697 A 9/1996 Chan .......................... 323/282
5,631,598 A 5/1997 Miranda et al.
5,668,464 A 9/1997 Krein et al.
5,795,850 A * 8/1998 Thorssen et al. ........... 507/203
5,889,393 A 3/1999 Wrathall
6,114,907 A 9/2000 Sakurai ...................... 330/253
6,246,221 B1 6/2001 Xi (Continued)

FOREIGN PATENT DOCUMENTS

EP 403174 A2 12/1990

(Continued)

OTHER PUBLICATIONS

Johns et al., Analog Integrated Circuit Design, John Wiley & Sons, Inc., New York, 1997.

*Primary Examiner*—Dinh T. Le
(74) *Attorney, Agent, or Firm*—Ohlandt, Greeley, Ruggiero & Perle, L.L.P.

(57) ABSTRACT

There is provided a noise canceling circuit that includes a first source terminal, a second source terminal, an output terminal, a reference voltage generator for generating a reference voltage, a bias current generator for generating a bias current determining an operating current, a voltage-current generator for generating an output of a power circuit, a voltage divider for detecting a fluctuation of an output voltage at the output terminal, and an error amplifier for amplifying an error voltage between said reference voltage and an output voltage from the voltage divider.

4 Claims, 22 Drawing Sheets

U.S. PATENT DOCUMENTS 6,304,131 B1 10/2001 Huggins et al.

FOREIGN PATENT DOCUMENTS

EP 1096671 A1 5/2001
JP 04-263303 9/1992
JP 05-035344 2/1993
JP 05-204476 8/1993
JP 08-272461 10/1996
JP 11-122195 A 4/1999
JP 2000-047738 2/2000
JP 2000-284843 10/2000
JP 2001-195138 7/2001
JP 2001-339937 12/2001

* cited by examiner

NOISE FILTER CIRCUIT

FIELD OF THE INVENTION

The present invention mainly relates to ripple noise cancellation in a stabilized DC power supply, and particularly provides a power circuit that achieves the high ripple noise cancellation rate with low operating current.

DISCUSSION OF THE BACKGROUND ART

Not only electronic equipments, but also all the other electronic devices contain a plurality of stabilized DC power supply voltages. The power circuits are disposed in digital circuits, high-frequency circuits and analog circuits, said power circuits having the characteristics suitable for use in these circuits. In a cellular phone, among others, the highest ripple cancellation rate is required because a poor ripple cancellation rate in a power supply of a transmitting section degrades the clarity of the voice conversation. Even in a digitally coded wireless communication means, a carrier signal is modulated and demodulated in an analog manner during the modulation and the demodulation, and therefore the power source ripple noises adversely influence the error rate. As to the cancellation of these ripple noises, for example, the cancellation rate of −80 dB can be achieved by causing a sufficient amount of the operating current of 100 μA to flow. Though some inventions are proposed as described later, there is no proposal that drastically reduces the low operating current and realizes the high ripple cancellation rate.

At present, it is assumed that a few billion of such equipments are operated all over the world. In case one power circuit is operated with 200 μA, it means that the current of 1,000,000 ampere flows in five billion power circuits. In case one power circuit is operated with 3V, it means that the electric power of 3,000 KW is consumed. The prior arts and the circuit theory based on the prior arts will be examined below by referring to the diagrams.

(1) Example of a Conventional Circuit

FIGS. 1 and 2 are a block diagram and a circuit diagram of a CMOS-type stabilized power circuit that has been conventionally used. In FIG. 1, the numerals 1 and 2 indicate voltage supply terminals. The numeral 50 indicates a reference voltage generation circuit that generates a reference voltage Vref. The numeral 60 indicates a circuit that generates a bias current for determining an operating current. The numeral 100 indicates an error amplifier circuit that amplifies an error voltage for the reference voltage Vref. The error amplifier circuit 100 is a two-stage amplifier; a differential circuit 10 is the first stage and a phase inversion amplifier 20 is the second stage. The numeral 40 indicates a circuit that detects a fluctuation of the output voltage and divides the voltage. The concrete example of the conventional stabilized power circuit is shown in the circuit diagram of FIG. 2. The reference voltage generation circuit 50 is connected to an input terminal N1 of the error amplifier, and the output divider circuit 40 is connected to an input terminal N2 of the error amplifier.

FIG. 3 is a graph that shows the DC characteristics in the conventional circuit shown in FIG. 2, showing the dependence on a power supply voltage Vdd by the output voltage Vout and the reference voltage Vref. The horizontal axis indicates the power supply voltage Vdd. The numeral 31 indicate an operating current. The numeral 32 indicates a gate voltage of an output transistor. The numeral 33 indicates the output voltage Vout and the numeral 34 indicates the reference voltage Vref.

FIG. 4 is a 10,000-times-expanded FIG. 3. The numeral 41 indicates the output voltage Vout and the numeral 42 indicates the reference voltage Vref. As shown by the numeral 42, generally, the reference voltage source Vref has a positive source voltage coefficient and has the properties, that as the source voltage rises, the output is increased. These properties are inconvenient for the ripple cancellation rate, whereby particularly the ripple cancellation rate in the low band is to be greatly influenced by the source voltage dependency coefficient of the reference voltage. Though it is not impossible to set the source voltage coefficient to zero, a trimming and a special voltage coefficient element need to be used. Therefore, this requires very great costs in a widely used semiconductor manufacturing method.

(2) Theoretical Formula of the Conventional Circuit

Next, the theory of the output voltage will be examined. The output voltage Vout is represented by the following formula:

$$Vout=Vref*(Av/1+K*Av)+So \quad (1)$$

In this formula, Vref indicates the reference voltage, Av represents a voltage gain of the error amplifier, K represents the division ratio of the divider circuit, and So represents a system offset voltage of the error amplifier.

The reference voltage Vref is influenced by the source voltage Vdd. Therefore, the change rate thereof is represented by the source voltage coefficient of Vref, $\Delta Vref=(\delta Vref/\delta v)/K$.

K is the division ratio of an output voltage-division resistance, and K<1. The high PSRR cannot be realized, unless the ripple noise ΔVref derived from Vref is rejected by a filter (PSRR means Power Supply Rejection Ratio, the ratio representing how much the output changes when the source voltage Vdd changes by 1V; for example, if the output changes by 1 mV, PSRR is 1 mV/1V, i.e. −60 db). The ripple noise of Vref contains a very low frequency and a high frequency component, and therefore a large time constant is required for a filter, whereby a filter rejecting all the frequency bands cannot be integrated on the same semiconductor chip.

In FIG. 4, Vref increases by about 10 μV (−100 dB), when Vdd is from 4v to 5v (0 dB). Vout increases by 90 μV:−82 dB).

K indicates the division ratio of the output divider circuit and is represented by the following formula:

$$K=R1/R1+R2$$

Here, R1 and R2 indicate resistors in the output divider circuit. If these resistors are made by polysilicon, the influence of Vdd can be neglected. Therefore, the rate of change of the source voltage Vdd is not taken into consideration. The value of K is a division value that determines the output voltage. Vref is generally from 0.2 to 0.8, and an extremely small or large value cannot be determined. Thus, this value contributes to the ripple reduction in a limited manner only.

So in the formula (1) represents the system offset voltage, which is unavoidably generated due to the circuit configuration. The system offset voltage is introduced by assuming its existence from an experimental value, on the basis of a way of thinking that has never been conventionally employed. It is empirically known that So is influenced by Vdd, and the formula (1) represents that So has a positive coefficient in most cases and, if a negative coefficient is feasible, So plays an important role.

Here, the source voltage coefficient is represented by $$So=\delta So/\delta v.$$

Av indicates an amplification factor of the entire circuit, has an open-loop gain and has a dependency on the source voltage Vdd as a matter of course. Therefore, the rate of change is represented by the following differential formula:

$$\Delta Av=(\delta Av/\delta v)/(1+KAv)^2$$

Incidentally, in case Av=10,000 times (80 dB), K=0.5, and the source voltage increases by 1V, 10,000 times is changed into 12,000 times, so that δAv=2,000 times and δV=1v. Thus, $$\Delta Av=80\times10^{-6}$$

When Vref=1.2V, the ripple component is equal to 96 μV (−80.5 dB), and it is clear that it cannot be neglected.

From the above-mentioned examination of the theory, it is clear that the total ripple component of Vout is represented by the following formula (2):

$$\Delta Vout=\Delta Vref+Vref*\Delta Av+\Delta So \quad (2)$$

(3) Examination of Stability

Next, as to the operation stability, the frequency theoretical formula of the gain, the poles and the zero points of each amplifier will be examined (see *Analog Integrated Circuit Design,* written by David A. Johns and Ken Martin, the first edition, John Wiley & Sons Inc., 1997, pages 223–224).

First, the gain of each amplifier is considered. In FIG. 2, the first stage 10, the second stage 20 and the output circuit 30 also have an amplifying effect. Therefore, assuming that, as seen from the amplifying circuit at the third stage, the voltage gain at each stage is Av1, Av2 and Av3, Av=Av1*Av2*Av3. Assuming that the gain of the $i^{th}$ amplifier stage is Avi, Avi is represented by the following formula (3):

$$Avi=Gmi*Zoi \quad (3)$$

Here, Gmi and Zoi are a conductance and an output impedance of the $i^{th}$ stage amplifier, and Zoi=Rpi//Rni//Coi (Rpi//Rni//Coi represents an output resistor of a P transistor i, an output resistor of an N transistor i and a parallel impedance equal to the capacity of an output i). Rpi is represented by the following formula (4) and Gmi is represented by the following formula (5):

$$Rpi=\alpha(Li/Idi)\surd(Vdgi+Vtpi) \quad (4)$$

Here, the symbol α indicates a correction coefficient and is approximately $5\times10^6\surd$V/m.

$$Gmi=\surd(2\ \mu p\ Cox(Wi/Li)Idi) \quad (5)$$

The symbols μp, Cox, Wi, Li and Idi represent a carrier mobility of a PFET, a unit capacity of a gate oxide, a channel width of a transistor i, a channel length and a drain current, respectively.

Next, the frequency characteristic will be considered.

The amplifier circuits at the first, second and third stages (the output circuit is the amplifier circuit at the third stage), respectively have the poles at the frequency of Fpi.

$$Fpi=\tfrac{1}{2}\pi*Zoi \quad (6)$$

As to the outputs of each stage, at the frequency Fpi, the amplification factor starts to be reduced at −6 dB/octave.

From the formula (2), it is clear that the larger amplification factor Av contributes to a reduction of the ripple component of Vout. From the formula (5), it is assumed that the circuit gain becomes higher by making the drain current Idi larger to some extent. On the other hand, according to the formula (4), the drain current Idi is made smaller, so that the output impedance becomes higher and the gain rises. Further, according to the formulae (4) and (5), when the drain current Idi is reduced, the polar frequency is reduced, and the gain is limited and does not reach the high frequency.

At this stage, the stability and the ripple rejection rate are not sufficiently examined, and the frequency characteristic relates to zero points. At the polar frequency, the gain is reduced by the rate of −6 dB/octave and, at the zero-point frequency, the gain rises by the rate of +6 dB/octave. In the normal state, the polar frequency is low and the gain shows an even characteristic.

According to an example of the prior art in FIG. 1, there are two zero points that greatly concern the frequency characteristic of the phase and the gain. The first zero-point frequency Fz1 is determined by an output smoothing capacitor C3 and a load resistance R3.

$$Fz1=\tfrac{1}{2}\pi*R3*C3 \quad (7)$$

The second zero-point frequency is also very important. The output circuit of the output transistor P4 is connected by a gold wire with the diameter of 25μ–30μ in the integrated power circuit. When its length is from 1 mm to 3 mm, it has a resistance from several 10 mohms to one hundred and several 10 mohms. Both ends of said gold wire that are bonded to a bonding pad and a lead wire have a contact resistance and a parasitic resistance. The total resistance is Rog=100 mohm–200 mohm. The equivalent series resistance ESR of the smoothing output capacitor C3 is also greatly related by the following formula.

$$Fz2=\tfrac{1}{2}\pi*(Rog+ESR)*C3 \quad (8)$$

(4) Examination of Zero-Point Frequency

C3 is used generally in the range from 1,000 pF to 10 μF. R3 greatly varies in dependence on a load current. For example, in case of about 10 ohm–100 Kohm, Rog=200 mohm and ESR=20 mohm, Fz1=0.15 Hz–1.5 MHz, and Fz2=72 KHz–7.2 MHz. Fz1 moves depending upon the current during the operation. When the load current is large, Fz1 moves to a very high frequency. In case of no load condition, it moves to very low frequency to make a large phase delay, which is likely to cause an unstable state. On the other hand, Fz2 does not depend on the load current, once the values of each section are set. However, the equivalent resistance ESR of the output smoothing capacitor greatly varies depending on the type of the capacitor. Namely, the ESR of a chemical capacitor ranges from a few ohms to a few 10 ohms. The ESR of a tantalum capacitor ranges from one ohm to a few ohms. The ESR of a ceramic capacitor ranges from a few mili-ohms to several 100 mili-ohms. Therefore, a capacitor of a certain type may make the operation unstable.

Fz2 will be explained in detail later and is an important element for the stability, because the phase delay influences the phase characteristic at about 180 degrees.

(5) Examination of Concrete Examples of Stability and Polar Frequency

As for the pole frequency Fpi, it is said that the stability of the stabilized power circuit is stable if the polar frequencies are isolated from each other. For example, it is said that no problem is caused if they are isolated by 10 times. The concrete examples of the polar frequencies at each stage will be examined.

The polar frequency Fp1 at the first stage is Ro1=300K–150K and Co1=0.1–0.2 pF, Fp1=about several 100 KHz–a few MHz. Since the frequency is high, the stability is comparatively unlikely to cause a problem. And, since Co1 is small, the additional capacity for performing the phase compensation can be small, and the position should be suitable choosen for the phase compensation. In FIG. 2, a series circuit comprising a capacity and a resistance is added between the gate and the drain of P3, so that a stable error amplifier can be constructed. However, in the conventional circuit, this phase compensation degrades the PSRR very much. According to the present invention, a sufficient phase compensation is carried out and the PSRR is improved in a canceling signal generation circuit mentioned later. Therefore, a power circuit with the high stability and the low operating current can be realized.

The second polar frequency Fp2 at the second stage is as follows:

Ro2=50K–100K; and

Co2=150 pF–200 pF.

Co2 is the sum of the gate capacitance of the output transistor and an additional capacitance C2. While changing in dependence on the output current standard the size of the output transistor, for example, by using a circuit with a large output transistor, a large capacitance should be included in Co2 from the first stage on. Though the second polar frequency Fp2 is approximately fixed during the operation, it becomes important in connection with Fp3 mentioned later.

The third polar frequency Fp3 at the last stage greatly varies during the operation, because Ro3 greatly varies in dependence on the load current. Under the no-load state, Ro3 becomes equal to the output voltage-dividing resistance, is lowered to several 100 Hz when the output voltage-dividing resistance is large, and the phase rotates from the low frequency. Therefore, the phase allowance is reduced and instability may be caused. In order to prevent it from occurring, an idling current is caused to flow through the output voltage-dividing resistance. This is one reason why the circuit current cannot be remarkably reduced.

When the large current flows, the polar frequency Fp3 rises to 150 KHz. At this time, when Fp3 is close to the polar frequency Fp2 and the gain is large, the operation becomes unstable. To avoid the instability, Fp2 needs to be deviated. In the present circuit configuration, Fp2 cannot be higher. According to the countermeasure in the prior art, generally Fp2 is decreased by increasing C2. However, this measure allows the power ripple noises to pass from pd to Vout, because a capacitor of a few pF–a few 10 pF is added to the gate of P4, so that the ripple noise rejection is unavoidably sacrificed thereby. Further, in response to a pulse change, a sufficient amount of operating current needs to flow through P3 for driving the output transistor P4 in order to make the charging and the discharging of the additional capacitor faster.

As described above, according to the conventional circuit configuration, it is inferred from the theoretical formula that: a sufficient operating current and a sufficient idling current are required to flow in order to attain an excellent ripple noise rejection rate (e.g. the characteristic of over −80 dB at 10 Khz) as well as excellent stability.

(6) Simulation Characteristic of the Conventional Circuit

FIGS. 5 and 6 are graphs illustrating the simulation result of the gain phase-frequency characteristics and the PSRR characteristics in the conventional circuit, where the current is high. The curves 51, 52, 53 indicate the gain characteristics of Vout, and the curves 54, 55, 56 indicate the phase characteristics. The curves 61, 62, 63 indicate the PSRR characteristics. The curves 51, 54, 61 indicate the case where the operating current is 100 μA or more. The curves 52, 55, 62 indicate the case where the operating current is 2 μA or less. A phase margin is an index for measuring the stability of a circuit, and it is defined as a phase difference from 180 when the gain is 1. It is said that the phase margin of more than 40 degrees from the 180-degree phase at the frequency with the gain of 1 means a good stability, and there is no oscillation. The gain margin is also an index of the stability of the circuit. It is defined as a reduction ratio of the gain in case the phase of the output signal is delayed by 180 degrees. It is said that, if the gain is reduced by more than 12 dB at the frequency, when the phase of the output is delayed by 180 degrees, it means good stability with no oscillation.

The phase margin will be examined below.

In FIG. 5, the phase curve 54 has the sufficient phase margin of about 50 degrees at the frequency 400 Khz where the phase curve 54 traverses 0 dB. The PSRR curve 61 indicates the PSRR characteristics, when the operating current is sufficiently large, and shows that excellent −90 dB characteristics are attained.

On the other hand, the numerals 52 and 55 show that the curve 55 has already passed 180 degrees, when the curve 52 is 0 dB, that the curve 52 still has the sufficient gain of 40 dB approximately at the frequency 10 Khz where the curve 55 traverses 180 degrees, and that the oscillation occurs approximately at this frequency. Namely, in the conventional circuit, when the operating current is decreased, the phase rotation occurs from the low frequency and the gain is not reduced, so that a stable operation cannot be attained.

The characteristic curves 53, 56 and 62 show the characteristics corresponding to the case where the output capacitance C3 is increased to 100 μF under the condition of an operating current around 2 μA, so that the phase characteristics are improved to enhance the stability. Due to the increase of C3, the 3rd pole Fp3 drastically comes down and the gain decreases by about 20 dB. The 2nd zero-point frequency Fz2 is set between 10 Khz and 100 Khz because of the large C3, to suppress the phase delay and greatly improve the stability. The phase curve 56 shows the phase margin of about 50 degrees in case the gain of the curve 53 is 0 dB. Thus, by adjusting the pole and the zero point, even the conventional circuit system can achieve sufficient stability under the condition of the very low operating current and realize a stabilized power circuit. However, C3 requires a large capacitance value and therefore the conventional circuit cannot be applied to a small apparatus. As a result, there is a problem that the PSRR is drastically decreased. The curve 62 in FIG. 6 indicates the PSRR characteristics corresponding to the curves 53, 56 and shows that the characteristics are degraded by no less than 40 dB or more around the 10 Khz frequency in comparison with the curve 61.

A curve 63 shows, for the purpose of comparison, a PSRR characteristic of the conventional circuit in FIG. 2, where the operating current is 2 μA or less. The circuit has a two-stage amplification structure and therefore an insufficient gain results in poor characteristics.

As described above, it is understood that the conventional circuit system cannot attain the excellent ripple rejection rate, unless the operating current is sufficiently large.

(7) Classification of Prior Arts

There have been many proposals about the ripple rejection in response to increasing market demands for a cellular phone and a wireless LAN. Those are categorized as follows.

(Category 1)

Method by optimization of polar frequency and zero-point frequency, and gain increase (see e.g. U.S. Pat. Nos. 5,631,598 and 6,304,131; JP Patent Application Disclosure Nos. 2001-195138, 2000-284843, 4-263303, and 5-35344)

(Category 2)

Method for operating the reference voltage source and the error amplifier by self stabilized voltage (see e.g. U.S. Pat. No. 5,889,393 and JP Patent Application Disclosure No. 5-204476)

(Category 3)

Method for adaptively controlling the polar frequency and the zero-point frequency under the no-load condition (see e.g. U.S. Pat. No. 6,246,221 and JP Patent Application Disclosure No. 2000-47738)

(Category 4)

Method of rejection by ripple filter (see e.g. JP Patent Application Disclosure No. 8-272461; and U.S. Pat. Nos. 5,130,579 and 4,327,319)

(Category 5)

Method of cancellation by reactor transformer (see e.g. U.S. Pat. Nos. 5,668,464 and JP Patent Application Disclosure No. 2001-339937)

Recently, the invention concerning Category 1 has been often proposed, and has the feature of excellent ripple rejection rate. However, current amplifiers are added to cause an increase of the number of components. And, basically, it applies the scope of the above-mentioned conventional theory. Therefore, the operating current cannot be drastically decreased. This problem still remains unsolved.

In the invention concerning Category 2, the unstable state occurs inevitably in the instant of switching from the original power source to the self-stabilized output at the time of starting-up, so that the time from the starting operation to the stabilization of the output becomes longer. While the invention has been lately applied to a cellular phone, etc., the power source is intermittently operated in order to save electric power, and therefore it is critical, inasfar as that it takes a long time to start up. Further, a precise level shift circuit is required between the error amplifier and the output transistor and the operating current is further increased. Therefore, a low consumption current cannot be realized.

In the invention concerning Category 3, as Category 1, the design theory in the error amplitude is still a conventional one and therefore the operating current cannot be decreased. The load current drastically changes and has the property to contain many noises. And, when the load current is fed back, it prevents the ripple rejection characteristics.

In the invention concerning Category 4, the ripple component contains the frequency band from a few Hz to the high frequency region. Particularly, in order to filter the ripples in the low frequency, the large time constant is indispensable and the integration on a semiconductor substrate cannot be realized without greatly increasing the costs.

In the invention according to Category 5, the large reactor transformer cannot be integrated and the application of this invention is limited.

In order to solve the above-mentioned problems, the present invention has the technical object of providing a ripple rejection circuit having a simple and clear design theory with excellent stability, said circuit having the feature that the various characteristics are not degraded even by decreasing the operating current to 1/100 or less of the conventional operating current and the circuit is not complicated.

SUMMARY OF THE INVENTION

According to the present invention, as technical means for achieving the above-mentioned object, a noise canceling circuit comprises: a reference voltage generation means for generating a reference voltage; a bias current generation means for generating a bias current determining an operating current; an error amplifier means for amplifying an error voltage for said reference voltage; a voltage-current output means for generating an output of a power circuit; and an output voltage-dividing means for detecting a fluctuation of the output voltage, wherein: said error amplifier means comprises an input part consisting of a pair of the 1-type semiconductor elements and a load part consisting of a pair of the 2-type semiconductor elements; a noise suppression part consisting of a pair of the 1-type semiconductor elements is disposed between said input part and said load part; and the pair of the elements of said noise suppressing part is constructed with a different size to thereby control the power voltage dependency of the output voltage.

Further, a noise canceling circuit comprises: a reference voltage generation means for generating a reference voltage; a bias current generation means for generating a bias current determining an operating current; an error amplifier means for amplifying an error voltage for said reference voltage; a voltage-current output means for generating an output of a power circuit; an output voltage-dividing means for detecting a fluctuation of the output voltage; and a canceling signal generation means containing at least one capacitance component, wherein: a first input terminal of said error amplifier means is connected to said reference voltage generation means; a second input terminal of the error amplifier means is connected to said output voltage-dividing means; said second input terminal is connected to said canceling signal generation means; the canceling signal generation means voltage-divides a noise signal by said capacitance component and a resistance component of the output voltage-dividing means, and advances the phase of the noise signal; the error amplifier means comprises an input part consisting of a pair of the 1-type semiconductor elements and a load part consisting of a pair of the 2-type semiconductor elements; a noise suppression part consisting of a pair of the 1-type semiconductor elements is disposed between said input part and said load part; and the pair of the elements of said noise suppression part is constructed in different size to thereby control the power voltage dependency of the output voltage.

Further, absolute values of a voltage dependency coefficient of the output voltage from the reference voltage generation means and the error amplifier means are −60 dB or less for a power voltage change of 1V, and the difference between the absolute values of the power voltage is −80 dB or less. The polarity of the power voltage dependency coefficient of the reference voltage generation means is opposite to the polarity of the power voltage dependency coefficient of the error amplifier means. The noise canceling circuit according to Claims 1 and 2 is as described above.

Moreover, the noise canceling circuit according to Claims 1–3 has the feature that a capacitance of a capacitance component of the canceling signal generation circuit is a subtle capacitance of 0.1 pF–0.001 pF.

Moreover, the noise canceling circuit according to Claims 1–4 has the feature that the bias current generation circuit is omitted, and the reference voltage generation circuit also serves as the bias current generation circuit.

DETAILED DESCRIPTION OF THE PREFERRED EMBODIMENT

The mode for carrying out the present invention will be explained below by referring to the diagrams.

Figure 1:
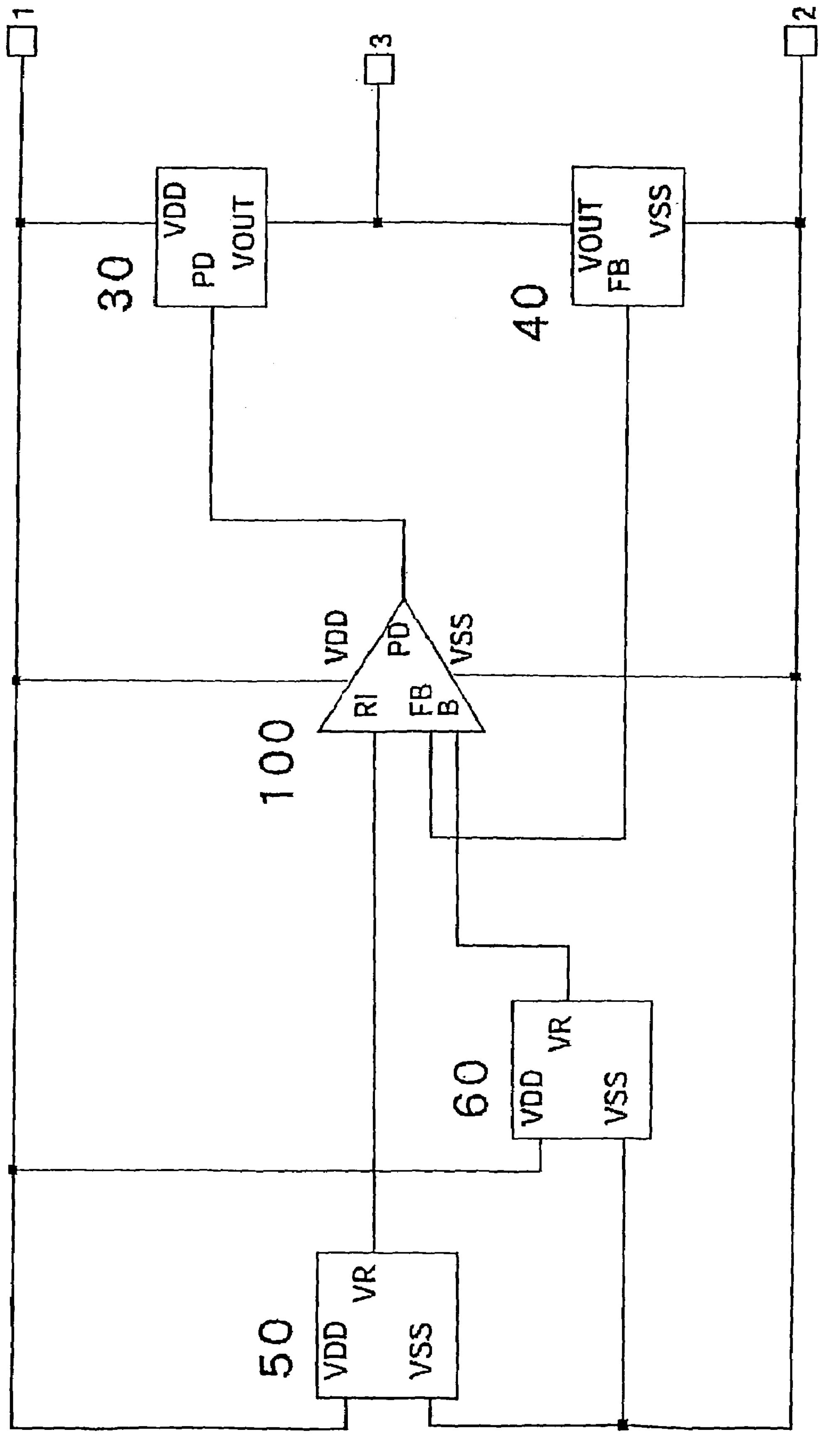
FIG. 1 is a block diagram showing one example of a stabilized power supply circuit.
Figure 2:
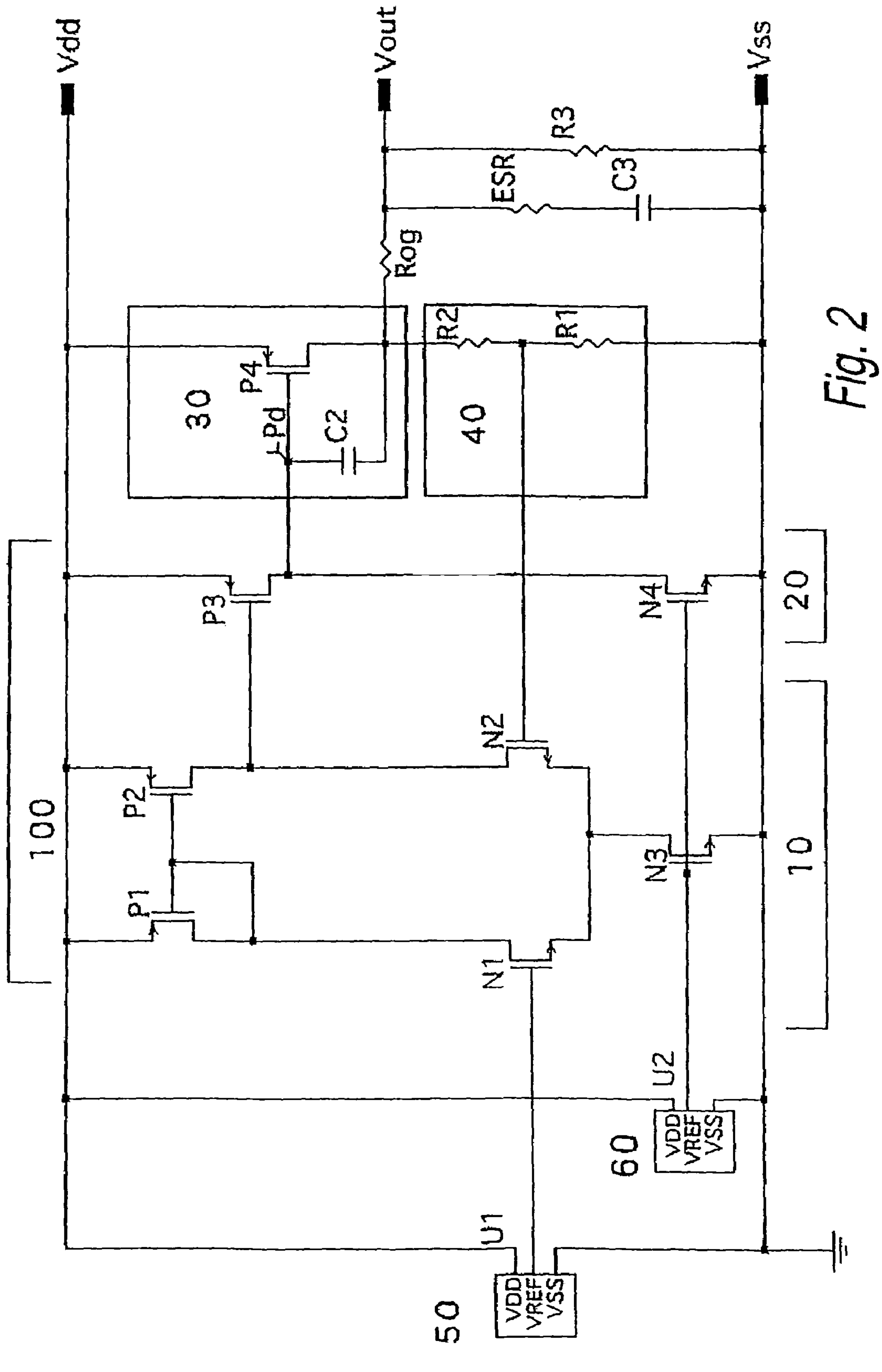
FIG. 2 is a circuit diagram showing one example of a stabilized power supply circuit.
Figure 3:
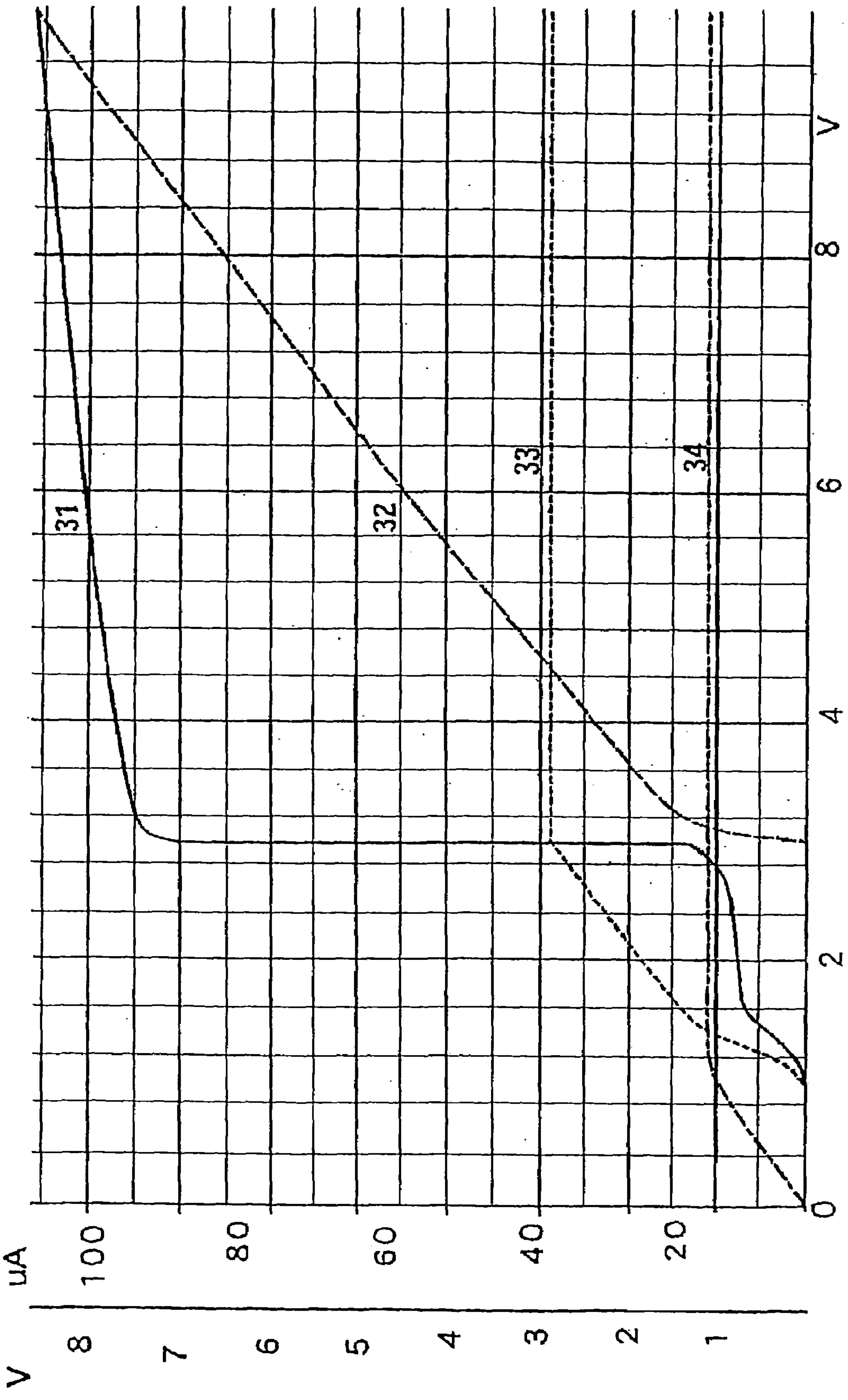
FIG. 3 is a diagram showing one example of the source voltage characteristics with respect to the output voltage in a conventional stabilized power supply circuit.
Figure 4:
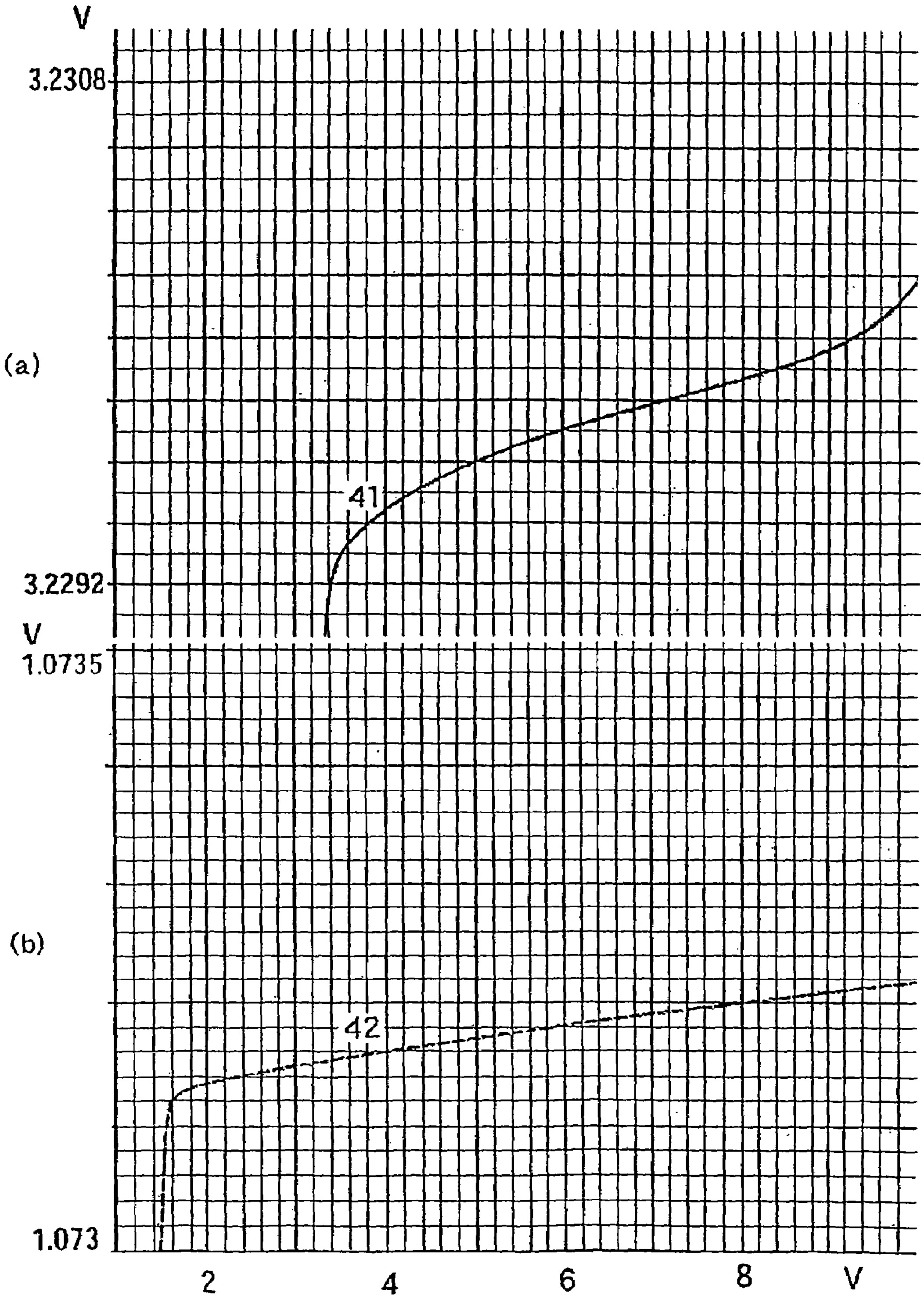
FIG. 4 is a diagram whose scale is expanded 10,000 times expanded FIG. 3.
Figure 5:
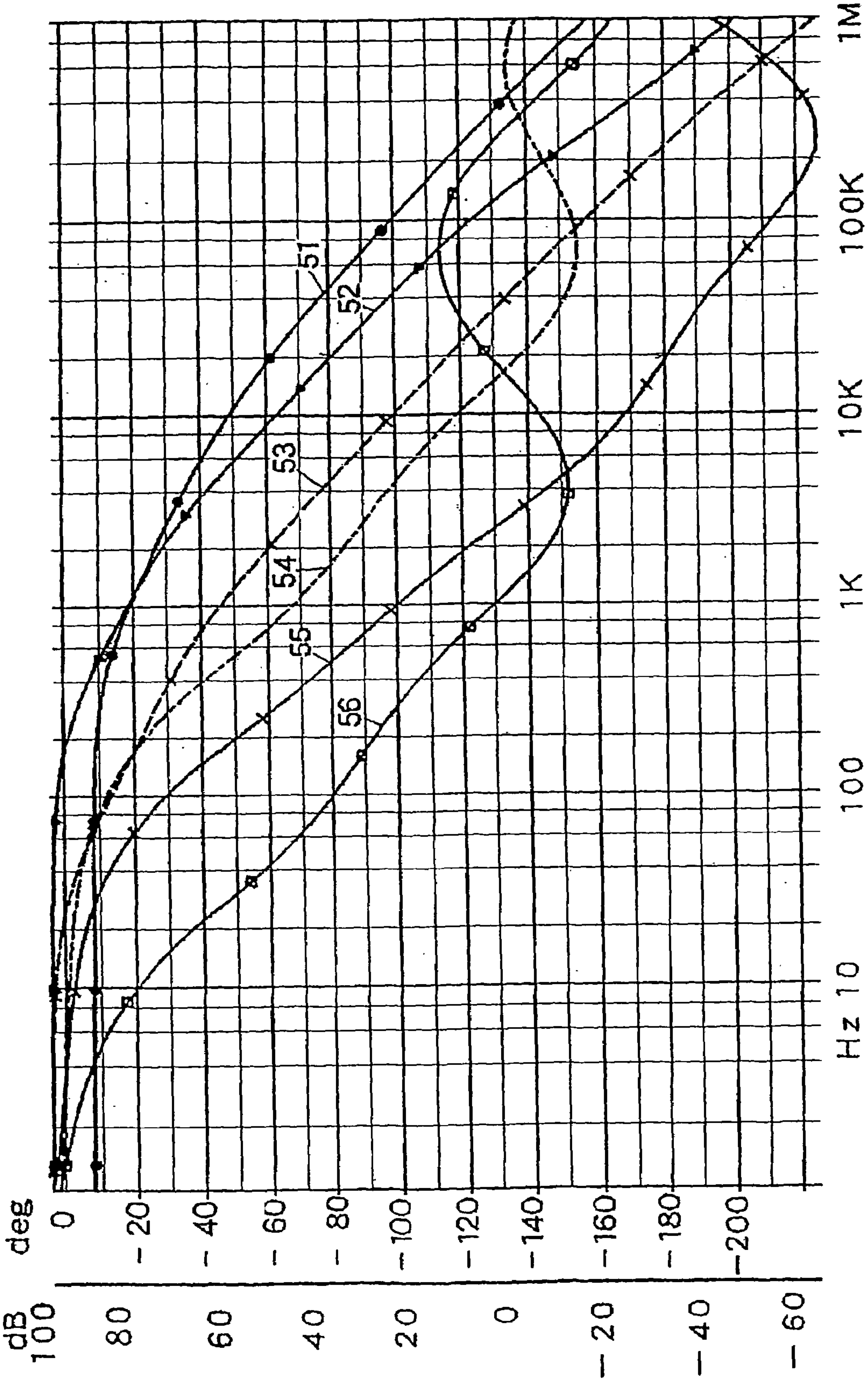
FIG. 5 is a diagram showing the output gain phase-frequency characteristics of a conventional stabilized power supply circuit.
Figure 6:
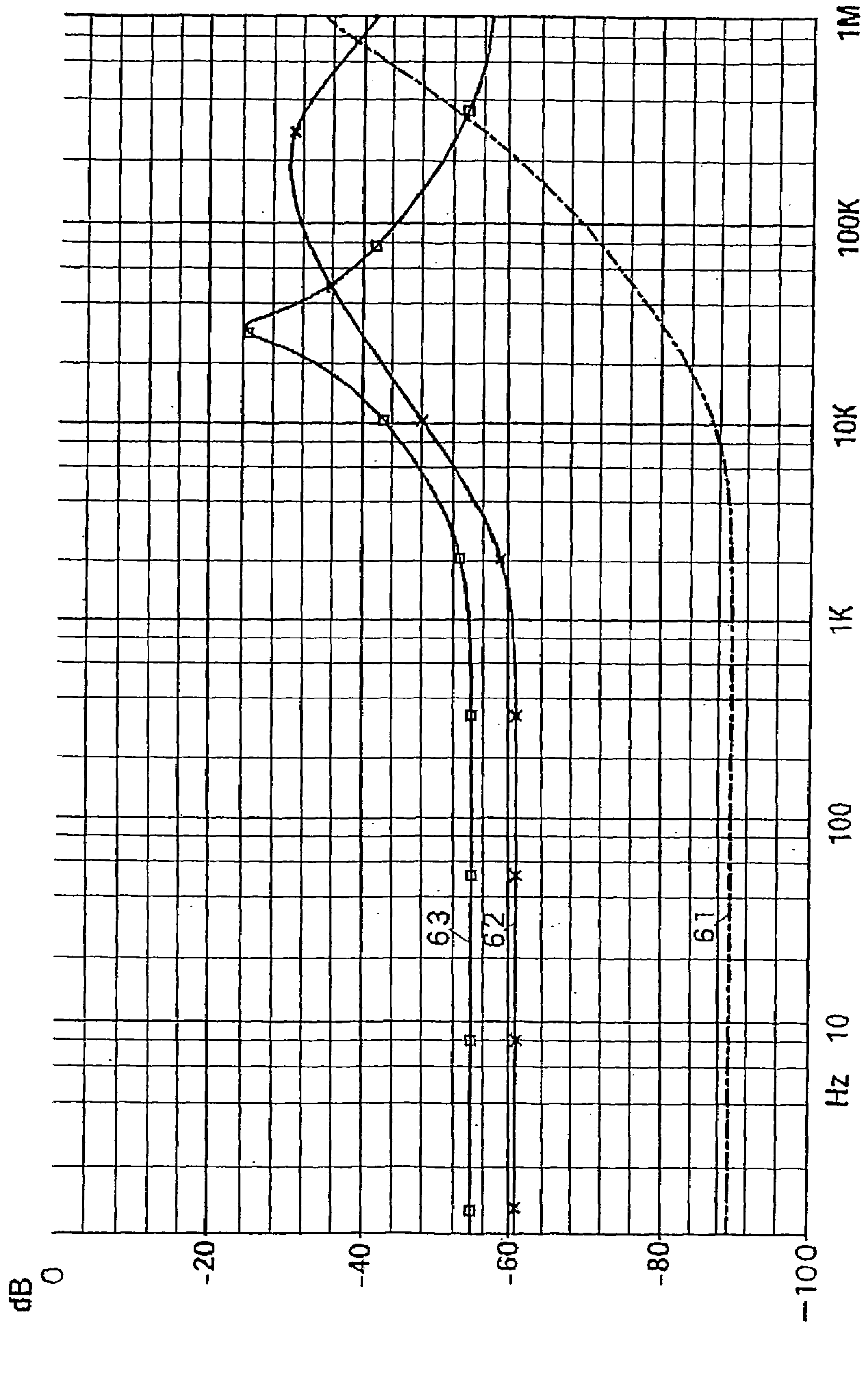
FIG. 6 shows the PSRR characteristics of a conventional stabilized power supply circuit.
Figure 7:
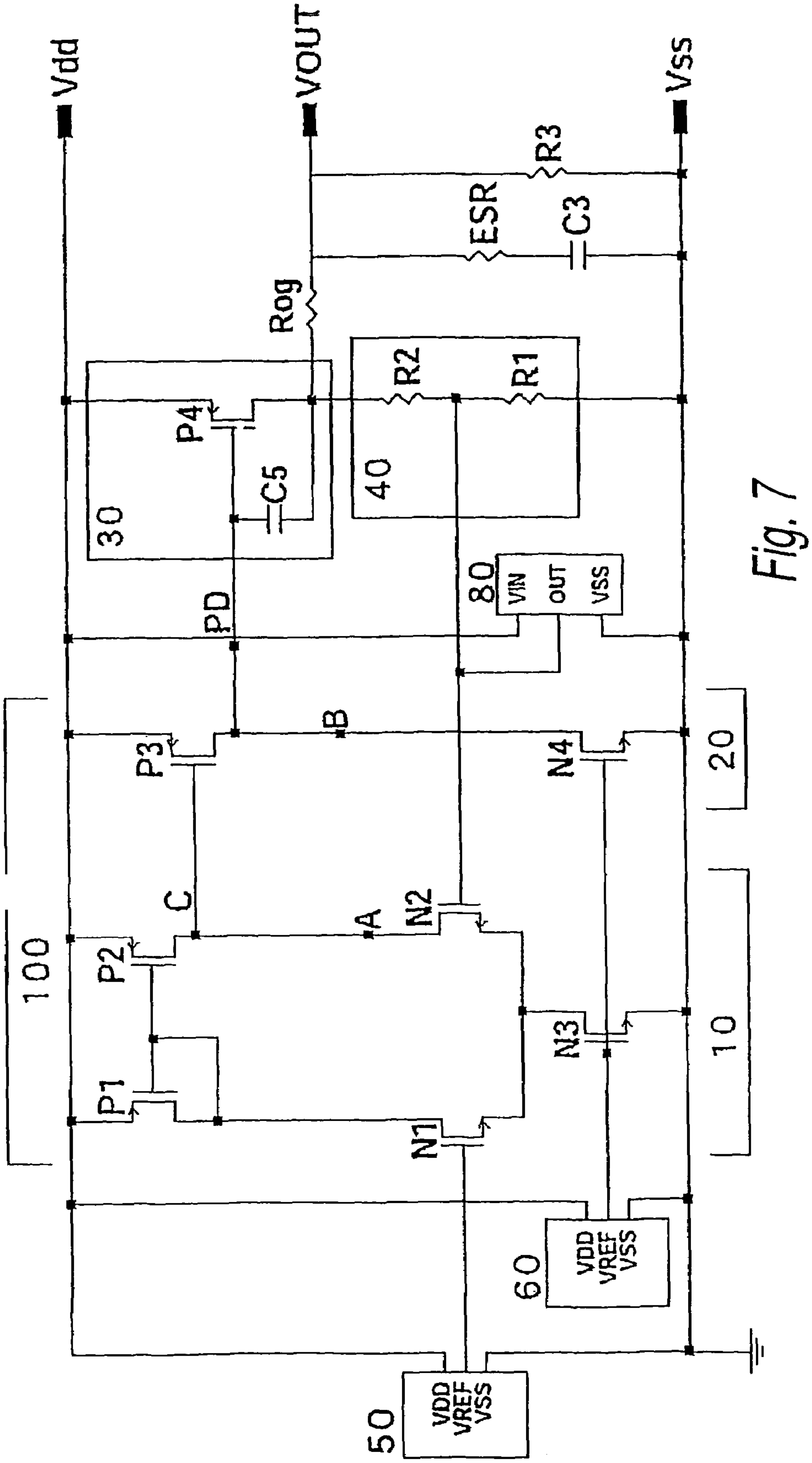
FIG. 7 is a circuit diagram showing the first embodiment of the present invention.
Figure 18:
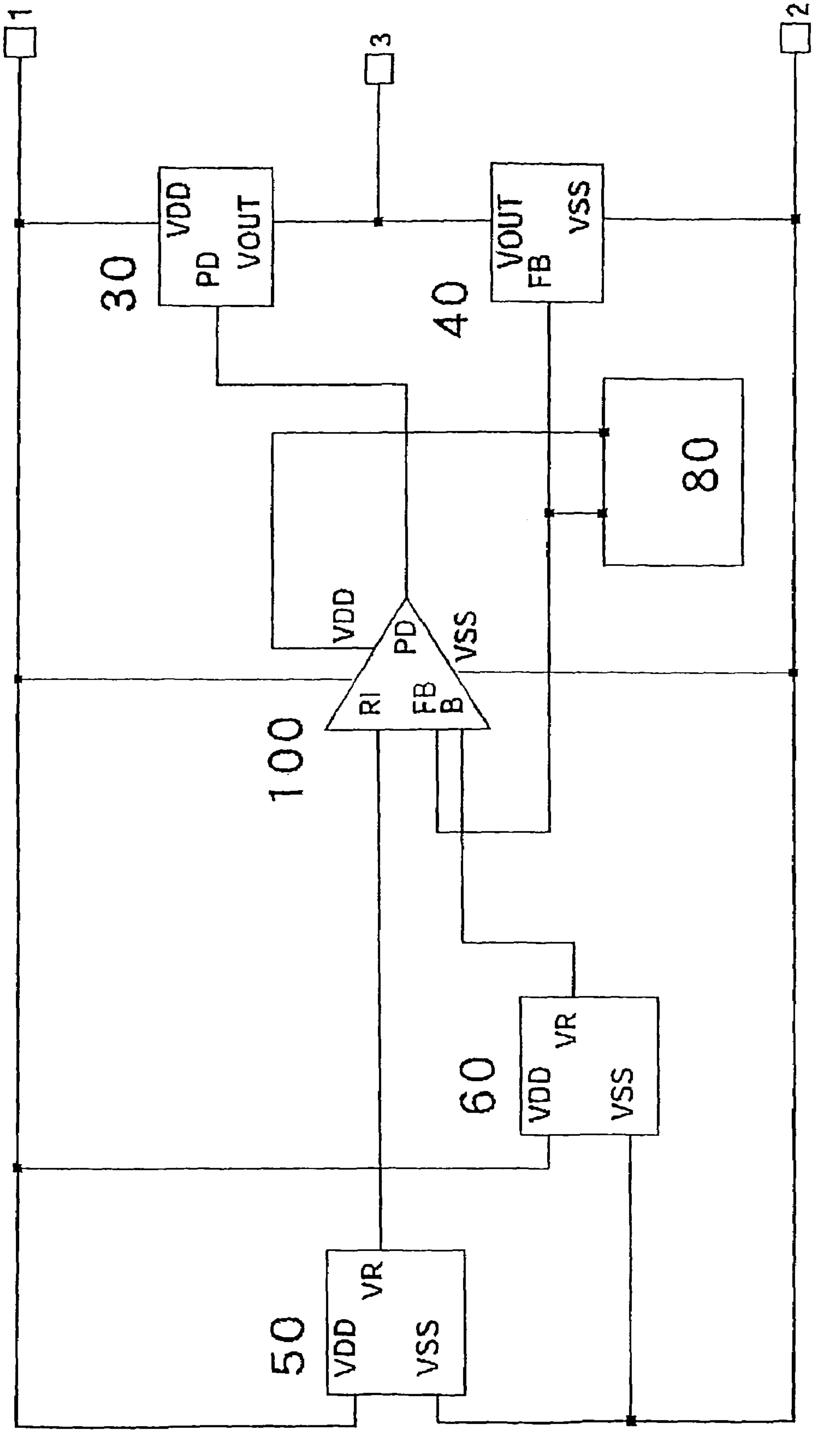
FIG. 18 is a block diagram showing the first embodiment of the present invention.

FIG. 18 is a block diagram showing a first embodiment, and FIG. 7 shows a concrete circuit configuration thereof. In line with the circuit configuration in FIG. 2, stated as prior art, in FIG. 7 the error amplifier 100 is a two-stage amplifier; a differential amplifier 10 as a first stage and a phase inverting amplifier 20 as a second stage. The numerals 30, 40, 50 and 60 indicate an output buffer, an error detection voltage-dividing circuit, a reference voltage circuit and a bias current generation circuit, respectively. The difference from the prior art lies in an additional canceling signal generation circuit 80 connected to the input terminal N2.

Figure 8:
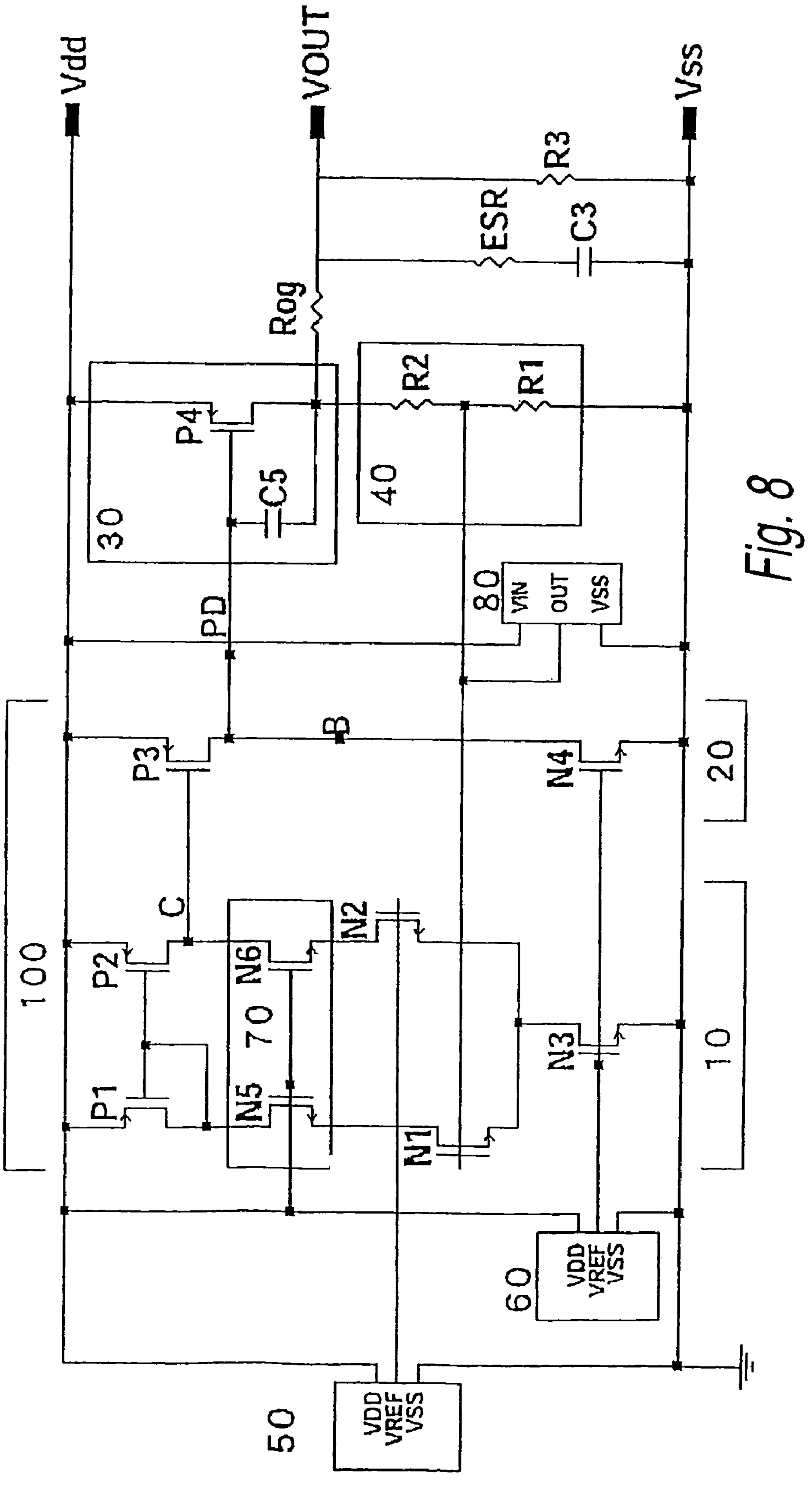
FIG. 8 is a circuit diagram showing a variation of the first embodiment of the present invention.

The canceling signal generation circuit 80 generates a very finely divided and advanced-phase signal from a noise signal generated in a power source line, and feeds it to the input of the error amplifier circuit, to reject the ripple noise in the high frequency band. FIG. 8 is a variation of the embodiment shown in FIG. 7, showing the circuit configuration where the error amplifier 80 has the structure of one stage with a canceling transistor array 70 added.

The operation principle and the canceling signal generation circuit will be explained below, while the working of the present invention is described.

(Working of Canceling Signal Generation Circuit)

The operation of the canceling signal generation circuit is very novel, but it is simple. A ripple noise of −100 dB for instance is equal to 10 μV/1V. Such small voltage and a phase are required to be accurately generated to cancel the ripple noise. For example, when the ripple noise on the supply line is 1V, it is required to be accurately divided into 1⁄100,000. Said phase should not greatly deviate, and the operating point of another circuit should also not greatly deviate. Though it seems easy to achieve such a subtle voltage-division ratio on a semiconductor chip by the pure resistance, it is very difficult to realize the subtle voltage-division ratio without a parasitic capacitance and therefore this has not been realized so far.

Figure 13C:
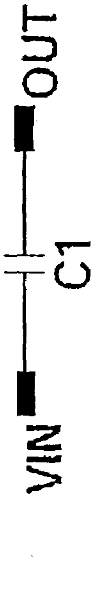
FIG. 13 is an example of the canceling signal generation circuit.
Figure 13B:
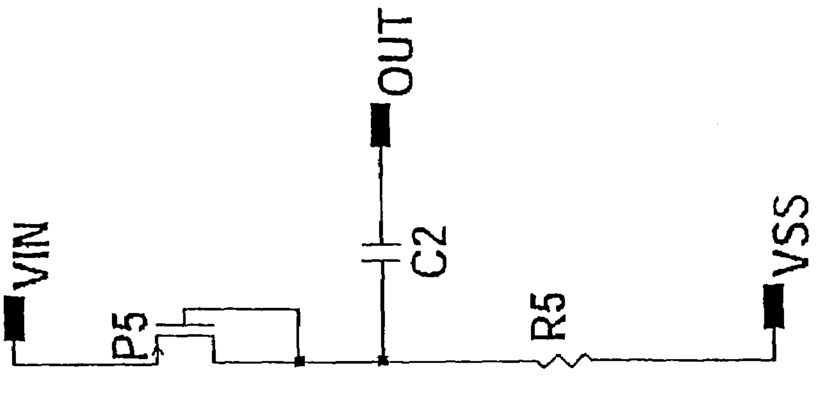
Figure 13A:
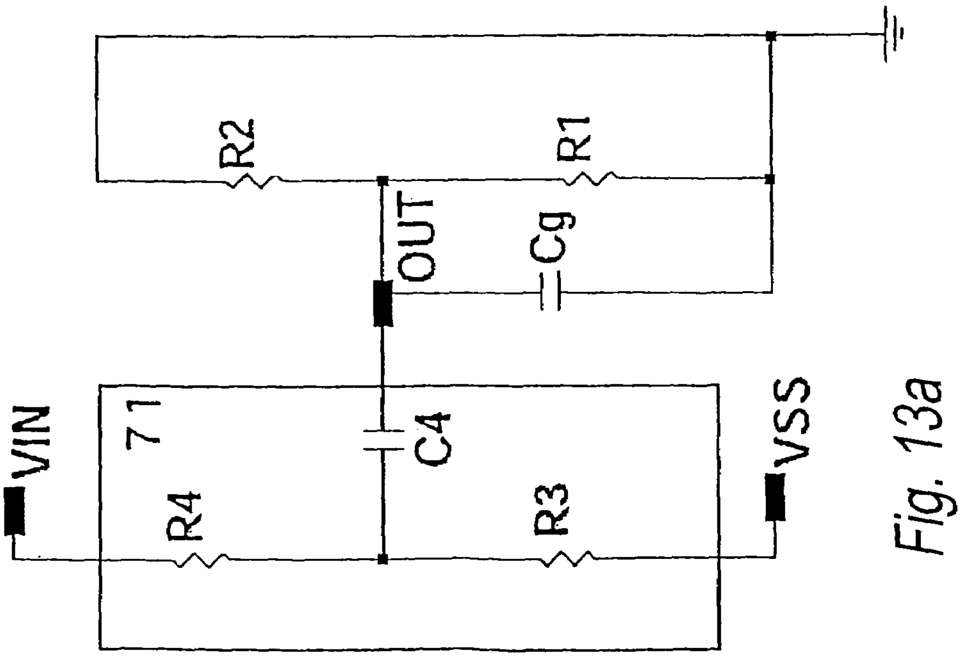

FIG. 13 shows a concrete example of the canceling signal generation circuit according to the present invention. In FIG. 13(*a*), the canceling signal generation circuit comprises resistors R3, R4 and a capacitance component C4 (see the portion enclosed by the line). This circuit is intended to perform the phase correction by the capacitance component after the voltage division by the resistance component. This is an improvement of the feature that, since R1 and R2 of the output voltage-dividing circuit 40 changes in response to the desired output voltage, the optimum canceling capacitor also changes. FIG. 13(*b*) shows a circuit configuration where the transistor P5 is used instead of the resistor R4. FIG. 13(*c*) shows an example where the circuit comprises C4 only. C4 can be also formed by a gate capacitance of an FET. Cg indicates a gate capacitance of the input transistor N2 of the error amplifier, and R1, R2 indicate the resistors of the output voltage-dividing circuit 40, which take part in the canceling operation. Assuming that a parallel resistance value of R3 and R4 is much smaller than the parallel resistance value of R1 and R2, the output from the canceling signal generation circuit is expressed by the following formula:

$$Z=R/(j\omega CgR+1) \quad (9)$$

$$Vc=\Delta VDD(R3/R3+R4)\ (j\omega CZ/j\omega CZ+1) \quad (10)$$

Here, Vc=(1⁄15000) volt, where R=1 Meg, C=0.1 p, ΔVdd=1V, and ω=2π10 Khz, and the phase is advanced by about 90 degrees.

According to the formula (9), the impedance is nearly equal to the one determined by the parallel resistance R in the frequency below a few 10 Khz. In the higher frequency, the formula (9) approaches zero and the canceling signal becomes smaller so that it does not exhibit a workable canceling operation.

While the phase advance varies depending on the value of the capacitor C4, the phase is advanced by 90 degrees approximately at 10 Khz. The noise cancel operation becomes feasible if C4 is set so that the phase delay caused by the $3^{rd}$ pole is canceled. The amplitude can be adjusted by the ratio of R3, R4 and the impedance ratio of C and R. And, when it is inputted to the input of the error amplifier, the canceling operation can be realized.

The canceling signal generation circuit according to the present invention has the feature that the capacitor and the resistor of the output voltage-dividing circuit 40 constitute the voltage dividing circuit. The voltage-division ratio and the phase advance, which are very subtle and optimum to the object, are realized with minimum costs and elements. Moreover, its effect is enormous.

In the formula (10), if R3 becomes infinite, (R3/R3+R4) approaches 1 as much as possible to thereby realize the state where C4 is directly connected. FIG. 13(*c*) shows this state. At this time, C4 is in the order of a very subtle capacitance fF, but it is possible to easily manufacture it on a semiconductor substrate.

As described above, according to the present invention, after the sufficient phase compensation is carried out, the signal inverse to the ripple noise is generated in a very simple method to cancel the noise. Therefore, the PSRR can be greatly improved without increasing the gain of the error amplifier and degrading the stability.

Figure 19:
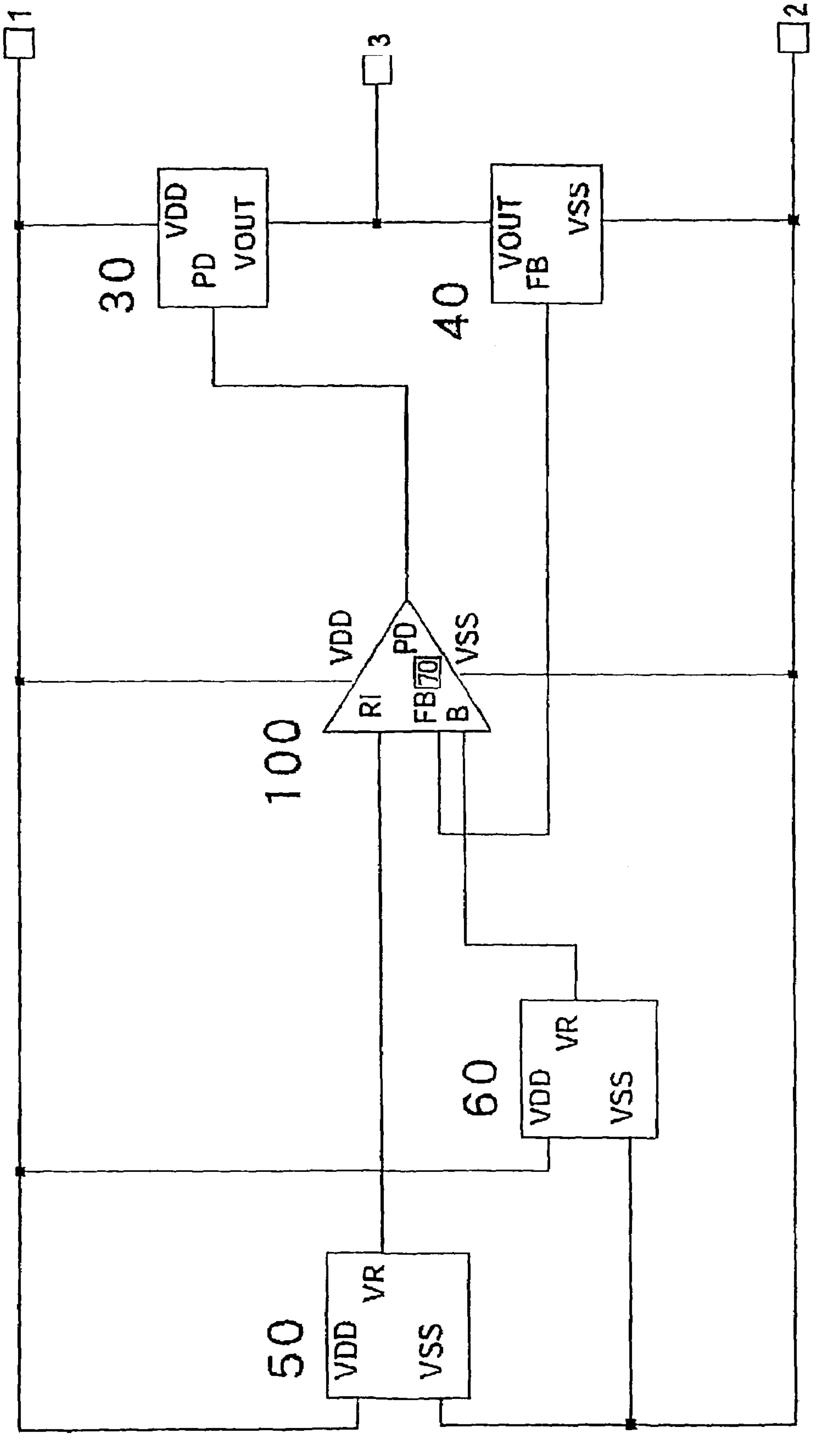
FIG. 19 is a block diagram showing the second embodiment of the present invention.

Next, the second embodiment of the present invention will be explained by referring to the block diagram of FIG. 19 and the circuit diagram of FIG. 15. The same constituent elements as those in FIG. 7 are indicated with the same numerals.

Figure 15:
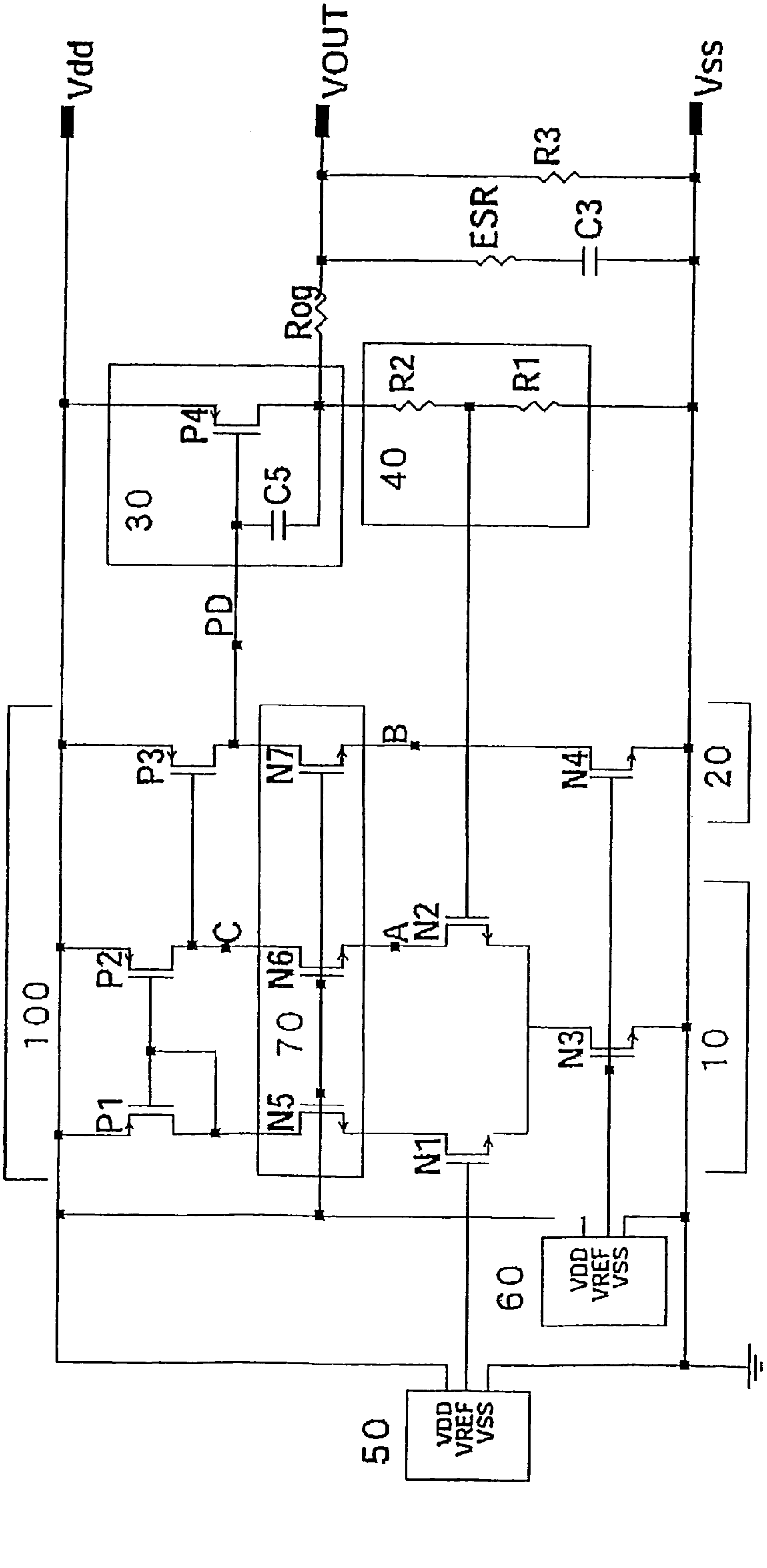
FIG. 15 is a circuit diagram showing the second embodiment of the present invention.

In FIG. 15, in comparison with the first embodiment shown in FIG. 7, the canceling transistor array 70, (N5, N6 and N7) is added. The gate of the canceling transistor array 70 is connected to the power source, and the ripple noise signal on the power source line is directly added.

The cascade transistors like N5 and N6, included in the canceling transistor array 70, are mentioned in the reference U.S. Pat. No. 4,533,877 that shows the improvement of the PSRR. Another reference U.S. Pat. No. 5,113,148 also exemplifies the cascaded transistors. The gate terminal of all the conventional cascaded transistors is connected to a dedicated reference voltage for matching the current values. Otherwise, a current mismatch with another constant current source in the same path makes the circuit unstable. In the present invention, the cascade transistor is directly connected to the power source to thereby make the operating current irrelevant to another constant current source. And, the ripple noise signal is intentionally fed to the gate and the mutual action with the source terminal is utilized.

As to N7, the operation of the cascaded canceling transistor will be explained. When the voltage Vdd of the supply line rises from a potential in operation and so does the gate potential of N7. While the drain of N7 tries to oscillate by the amplitude approximately identical to Vdd to increase the current, the source potential is subject to the back-gate effect and the increase of the current of N7 can be suppressed. As a result, the decrease of the pd potential is suppressed and the increase of the output voltage Vout of P4 is suppressed. The current of N7 is expressed by the following formula:

$$Id=0.5*\mu n*Cox*(W/L)*(Vgs-Vtn)2*(1+\lambda(Vds-Veff)) \quad (11)$$

$$Vtn=Vt\mathbf{0}+\gamma(\sqrt{}(Vab+2\Phi F)-\sqrt{}\phi F) \quad (12)$$

where Vgs=gate source voltage, Vtn=threshold voltage with back-gate, Vds=drain-source voltage, Veff=Vgs−Vtn, λ=LAMDA coefficient, Vt0=threshold voltage without back-gate, Vsb=source-substrate voltage, ϕF=Fermi level, and γ=coefficient of back-gate effect. The symbol λ is called early voltage coefficient, and indicates a coefficient concerning how much the drain current increases in response to the voltage between the source and the drain. The symbols λ and γ are the coefficients determined during the manufacturing process.

The formula (12) shows that Vtn increases as the source potential Vsb of N7 rises. Even if Vgs and Vdd go up in the formula (11), Vtn rises at the same time and therefore the current Id is not directly proportional to the rise of Vgs. Namely, it can be certainly said that, as the coefficient γ becomes larger, the suppression effect, i.e. the cancellation effect of the current Id, becomes greater. The early-voltage coefficient λ is called a channel length modulation coefficient, and the larger the channel length L becomes, the smaller λ is. Thus, the relation between λ and L is complicated. Accordingly, the relation between the N7-transistor size and the cancellation effect is not determined simply and directly. However, with the standard manufacturing parameter, the canceling effect can be controlled by changing the channel length of N7.

Figure 16:
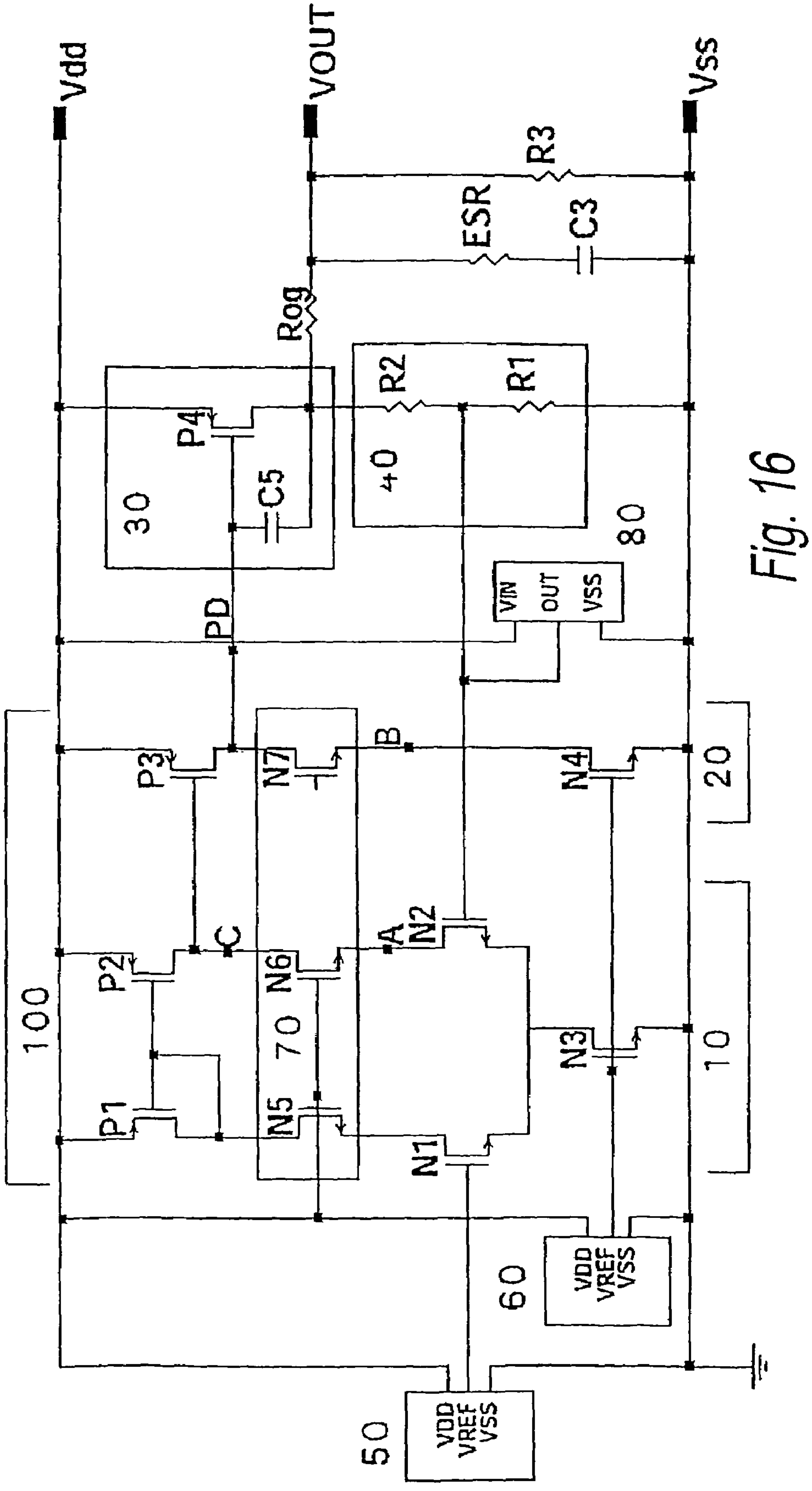
FIG. 16 is a circuit diagram showing the third embodiment of the present invention.
Figure 20:
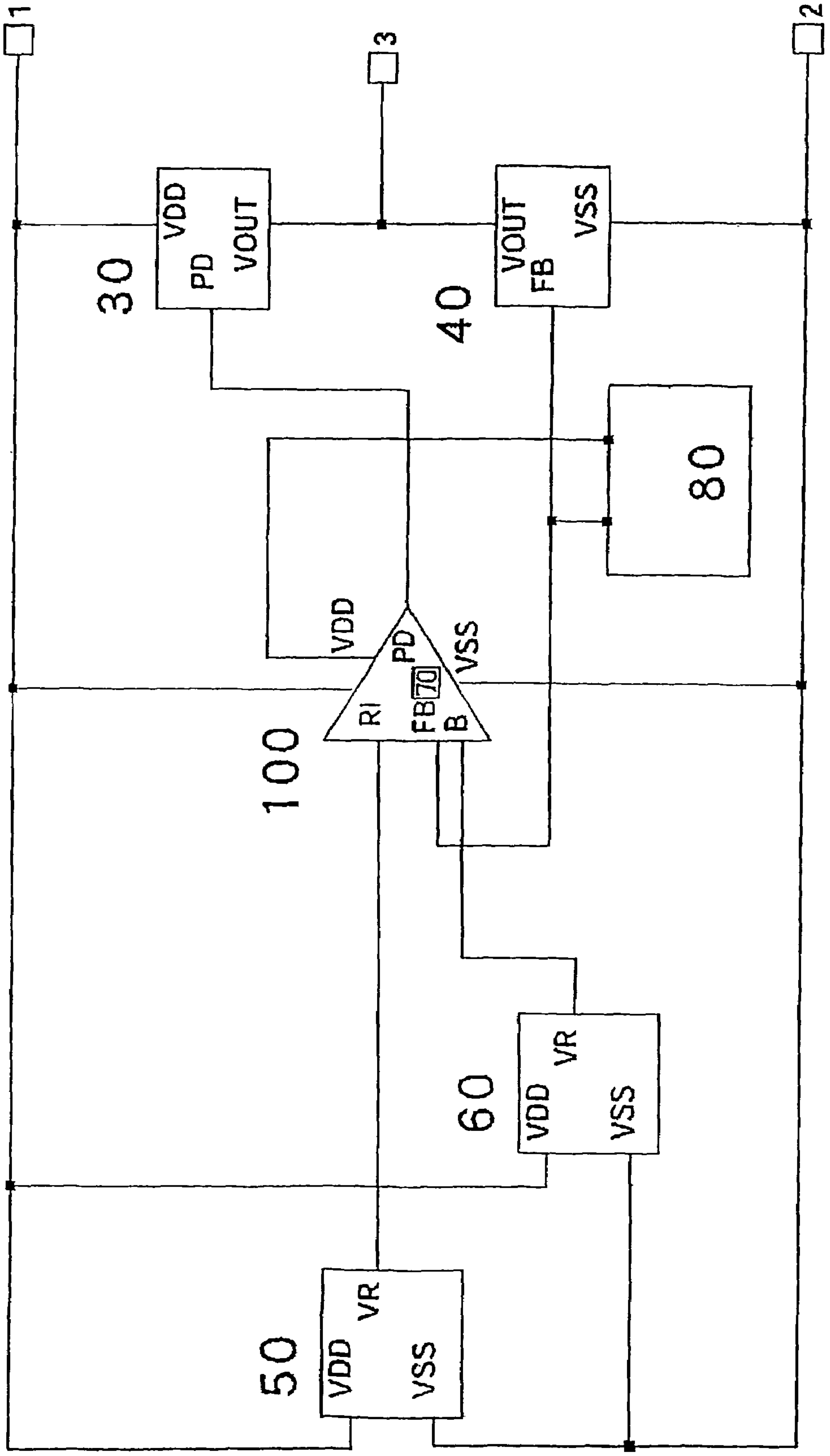
FIG. 20 is a block diagram showing the third embodiment of the present invention.

A block diagram in FIG. 20 shows a third embodiment of the present invention. The circuit shown in FIG. 16 is its concrete circuit configuration. The same components as those in FIG. 7 are designated by the same symbols. In the present embodiment, both of the canceling signal generation circuit 80 and the canceling transistor array 70 are implemented.

Figure 17:
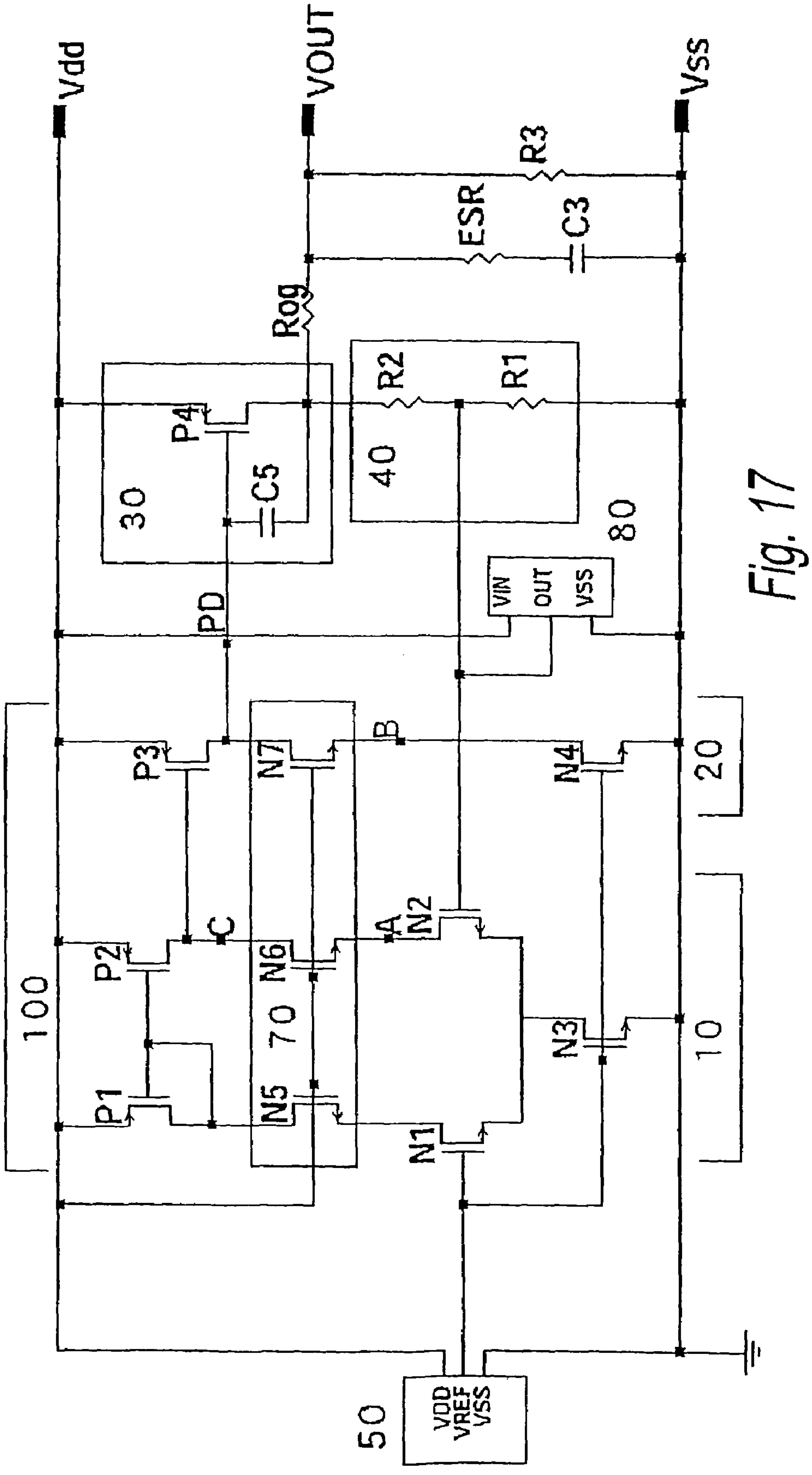
FIG. 17 is a circuit diagram showing a variation of the third embodiment of the present invention.

As a variation of the above-mentioned embodiment, a circuit diagram is shown in FIG. 17. In this circuit configuration, the bias current generation circuit 60 is omitted and the reference voltage generation circuit 50 can also serve as the bias current generation circuit.

(Inclination of System Offset—1)

Figure 9:
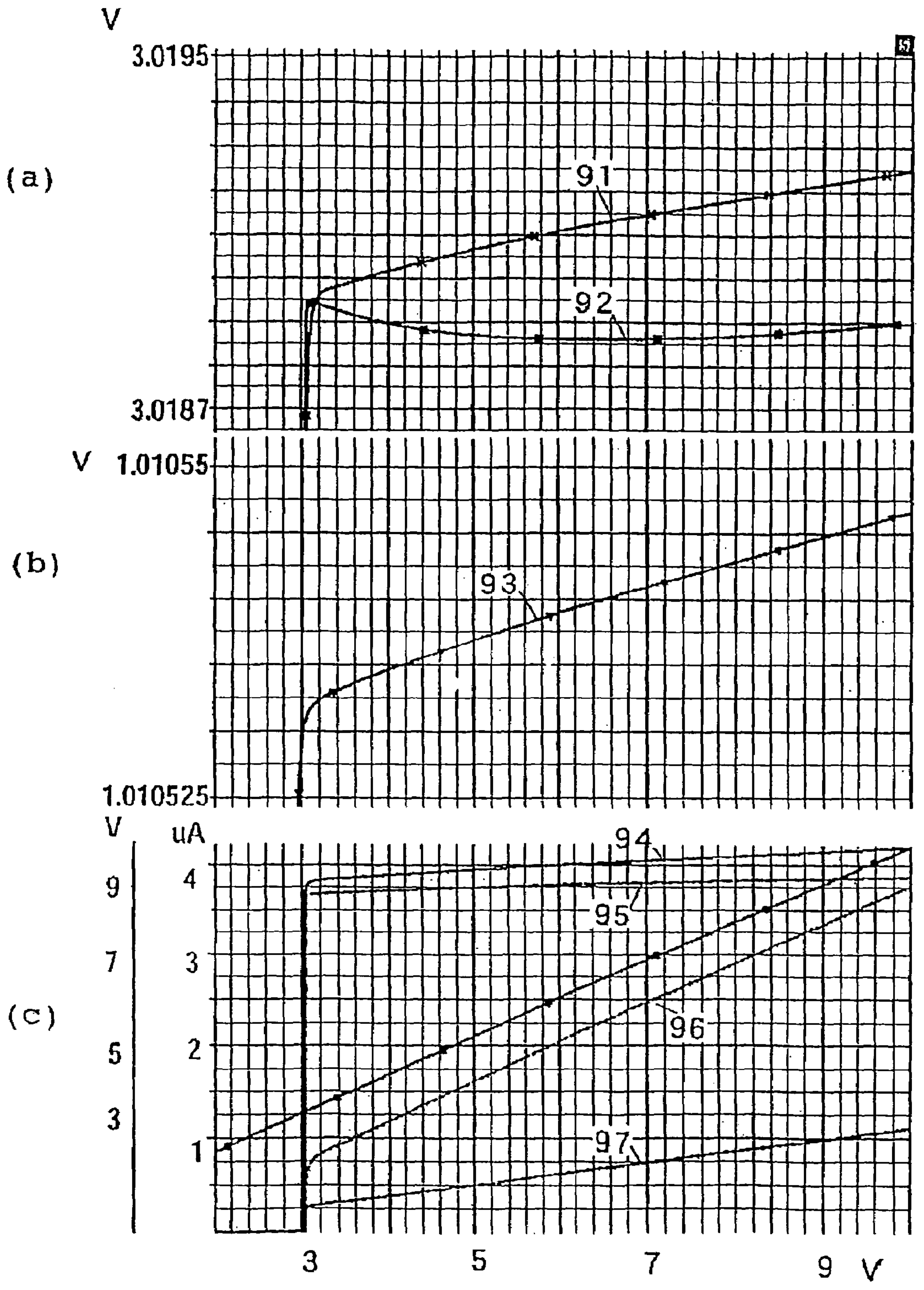
FIG. 9 shows the source voltage dependency of the voltage in each section of the circuit in FIG. 16.

FIG. 9 is a graph showing the simulation of the dependency characteristics of each circuit section when the power voltage Vdd changes in the embodiment shown in FIG. 15. The curves 94 and 91 indicate the drain current and the output voltage Vout of P3, respectively in case of absence of the canceling transistor. The curves 95 and 92 indicate the current and Vout of P3, respectively in case of presence of the canceling transistor N7. When the curve 94 and the curve 95 are compared, it is clear that the canceling transistor N7 suppresses the current increase in the curve 95 in comparison with the curve 94. The curves 91 and 92 in FIG. 9(*a*) are expanded graphs of the vicinity of Vout. It is clear from this diagram that the canceling transistor N7 suppresses the current increase and Vout shows a negative slope.

The curve 96 in FIG. 9(*c*) indicates the drain voltage of N7, i.e. the voltage of the PD node. The straight line just above the curve 96 represents the state of increase of the power voltage. The numeral 97 indicates the voltage of the source terminal of N7. This voltage rises with the power voltage, and this means that, in the transistor N7, the back-gate bias effect strongly works as the power voltage rises.

As to the range of inclination of 91, 92 and 93, it is desirable that the source voltage change is 1 mV per volt (−60 dB) or less and the difference of the absolute values of the source voltage dependency coefficients is −80 dB or less. When the inclination of the positive coefficient of the reference voltage source is added to the error amplifier of the negative coefficient obtained here, the ripple noise caused by the source voltage fluctuation in the low frequency region can be reduced to zero as much as possible. The inclination of the numeral 93 indicating Vref in FIG. 9(*b*) is equal to ΔVref in the above-mentioned formula (2). The numerals 91 and 92 indicate Vout. The numeral 91 indicates the inclination of Vout in case where ΔSo in the formula (2) has a positive coefficient. The numeral 92 indicates the case where, if ΔSo has a large negative value, its influence causes Vout to have a negative inclination. In the opposite case (where the reference voltage source is negative and the error amplifier is positive), too, the same effect can be achieved. The minus inclination indicated by the numeral 92 occurs depending on the operating current of N7 and the manufacturing parameters in the formula (11), and its properties can be always used, though it cannot be arbitrarily set. Therefore, the inclination can be made even without fail by means of N7.

As described above, PSRR can be easily improved by changing the size of the canceling transistor N7.

(Inclination of System Offset—2)

Figure 21:
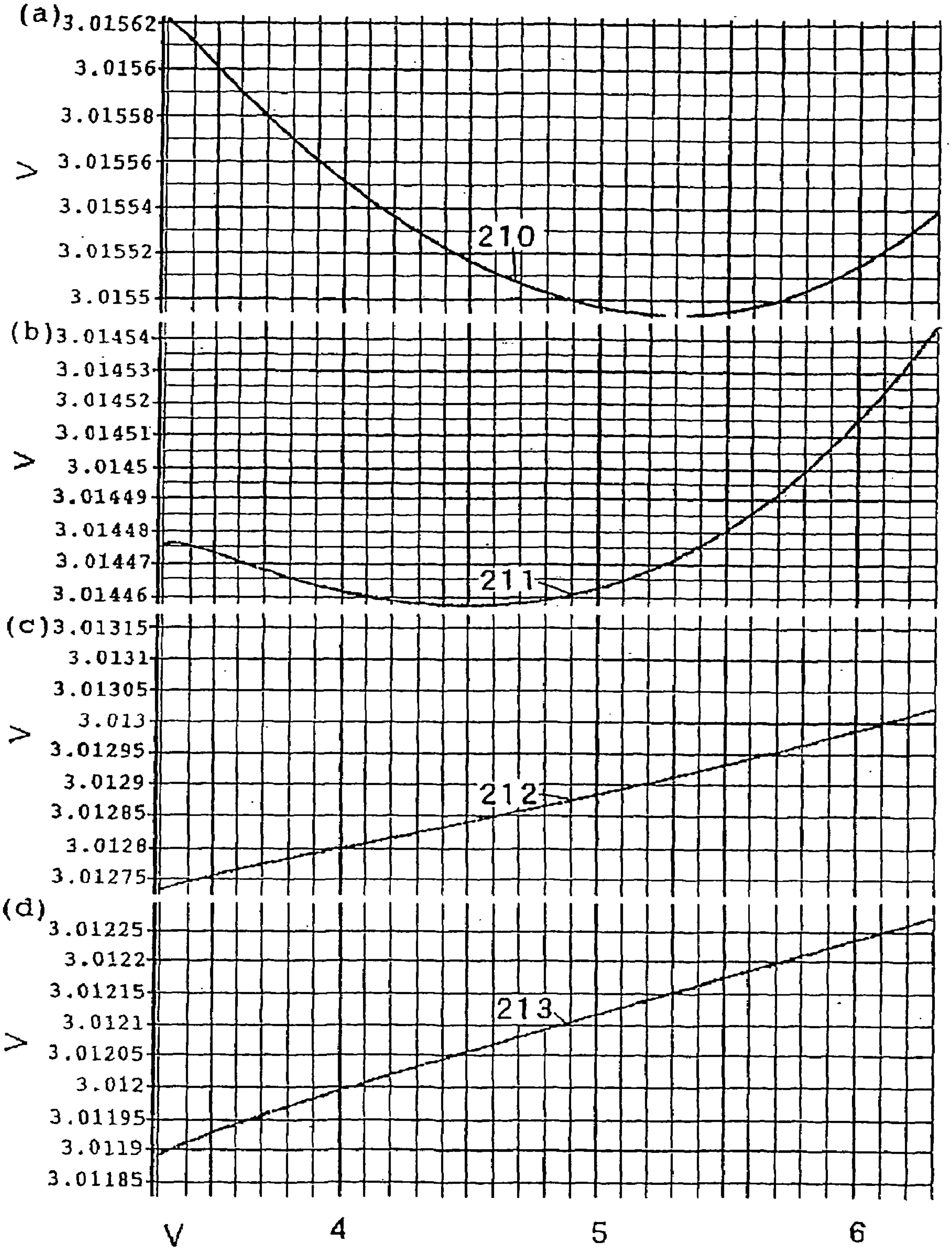
FIG. 21 is a diagram for explaining the canceling operation of the present invention.

In FIG. 15, N5 and N6 are normally constructed in the same size. The differential amplifier 10 of the error amplifier 100 is in balanced operation and N5, N6 are operated on the basis of the same current, if the two inputs are equal to each other. The present invention proves that the sizes of N5 and N6 are made different to thereby cause the differential circuit to be operated in the unbalanced state, so that the ripple noise can be suppressed. FIG. 21 shows the source voltage change of the output voltage under the following conditions: The channel length of N5 is constant; and the channel length of N6 is modified into the same size as N5 as seen by the curve under numeral 210, to twice larger size as seen by the curve under numeral 211, to six times larger size by the curve under numeral 212, and to ten times larger size as seen by the curve under numeral 213. The curves 213 and 212 have a positive inclination and vary by about 250 μV between 3.5V and 6V. The numeral 210 indicates a negative inclination, showing a change of 130 μV. The numeral 211 indicates an approximately even inclination, showing a change of only 5 μV between 4V–5V. In the low frequency, PSRR is equal to the change in the inclination of the output voltage with respect to the source voltage, and the curve 211 shows an excellent PSRR.

Figure 22:
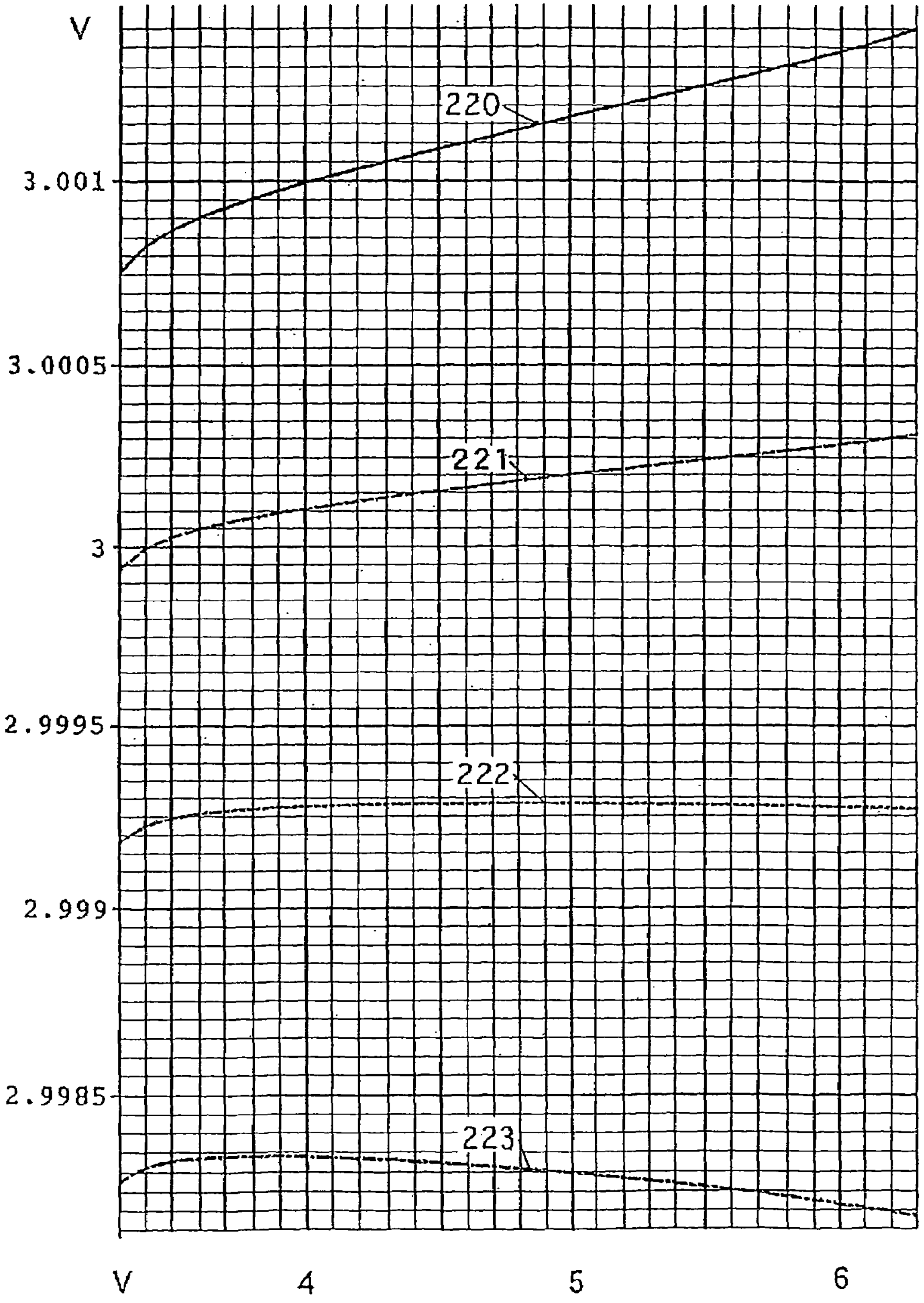
FIG. 22 is another diagram for explaining the canceling operation.

FIG. 22 shows the source voltage change of the output voltage under the following condition: In FIG. 8, the channel length of N5 is constant; and, as to the channel length of N6, the curves 220, 221, 222, 223 correspond to 25% less channel length compared to N5, the same, 25% larger, 2.2 times larger size, respectively. The curve 220 indicates a positive inclination, and the curve 223 indicates a negative inclination.

The curve 222 indicates a slightly negative inclination in the vicinity of 4V and a nearly flat inclination. This shows that the PSRR of the curve 222 is excellent.

Thus, it is proven that the imbalanced size of the cancel transistors improves the PSRR characteristics. Such method is unprecedented and the effect is remarkable. The channel length of N6 is changed by e.g. cutting a distribution fuse after the fabrication, so that PSRR can be subject to direct trimming.

Thus, according to the canceling transistor according to the present invention, the ripple noise signal generated on the power source line is used for the cancellation per se. Therefore, PSRR in the low frequency region can be drastically improved without increasing the gain of the error amplifier and degrading the stability.

A reference voltage circuit cited in the present invention will be mentioned.

Figure 11:
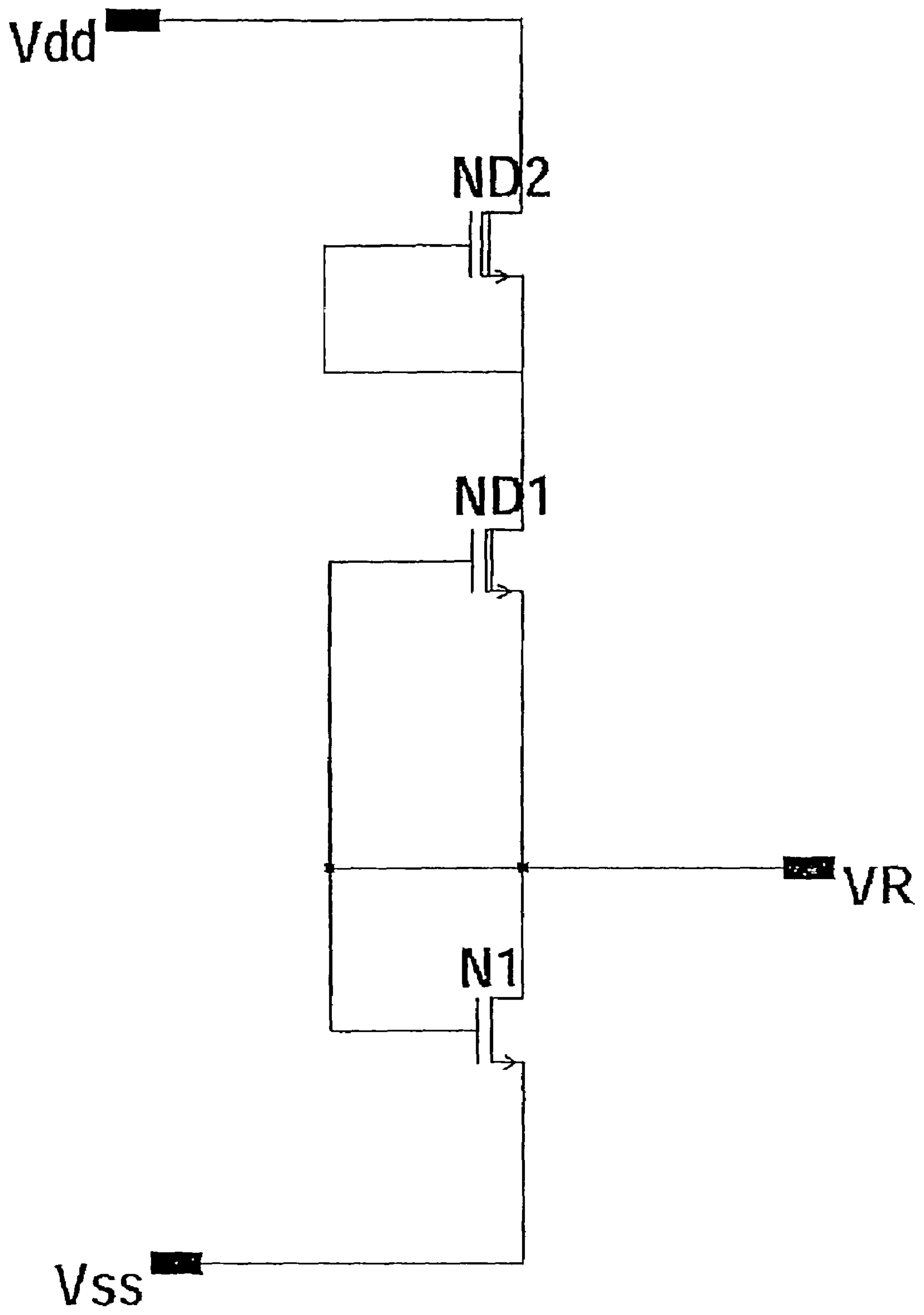
FIG. 11 shows an example of the reference voltage generation circuit.

FIG. 11 is a concrete example of the reference voltage source. The voltage coefficient is δVref/δv, which has a positive coefficient from the numeral 93 in FIG. 9(*b*). This exemplary circuit is cited from U.S. Pat. No. 4,417,263, ND1 and ND2 indicate depression-type N-channel FET, which constitutes a constant current source for supplying a constant current. N1 indicates an enhancement-type N-channel FET, which is diode-connected. Therefore, when a constant current flows through it, a constant voltage is generated at both ends and serves as a constant voltage source.

Figure 10:
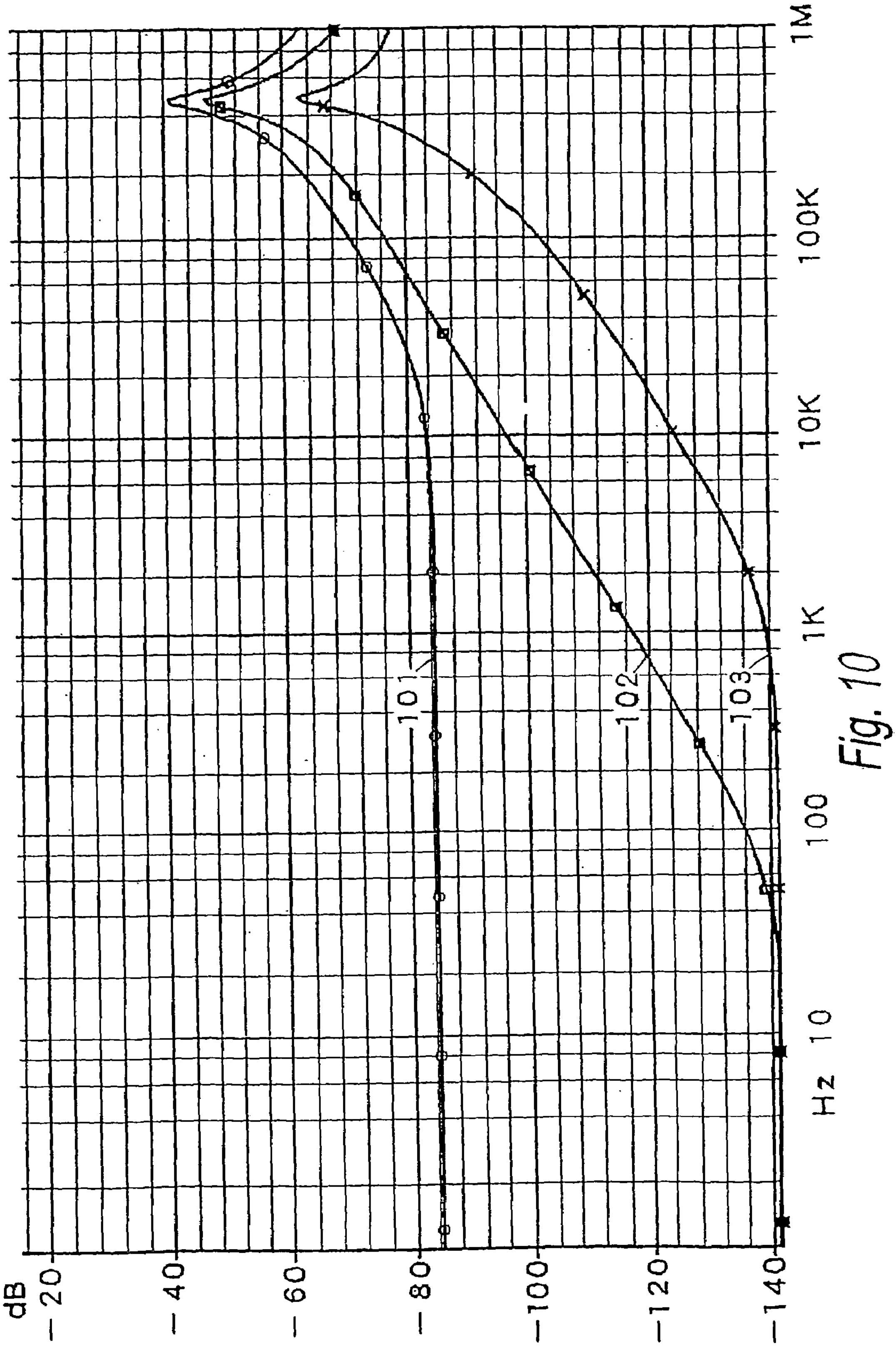
FIG. 10 shows the canceling operation as to the PSRR characteristics of the present invention.

FIG. 10 is a graph showing a simulated PSRR curves for the circuit in FIG. 16. The curve 103 shows the PSRR characteristics of the circuit shown in FIG. 7. The curve 101 shows the PSRR characteristics when the canceling transistors N5, N6, N7 are shorted between the source and the drain. As shown in FIG. 10, the PSRR curve 103 is far better than the curve 101 by 60 dB under only a few μA operation current. The curve 102 in FIG. 10 correspond to the case of the operation of the disable canceling signal generation circuit mentioned later, and shows that the characteristics are degraded in the high frequency range, when the cancellation operation is omitted.

(Difference from Conventional Phase Compensation)

The presented invention "Noise cancel capacitor" belongs to different category from the so-called phase compensation in an amplifier. Except for special cases, the conventional phase compensation is carried out, basically by connecting two points having the phases opposite to each other by means of a capacitor to effect a negative feedback, so that the frequency characteristics are changed. For example, in a certain case, a capacitor, etc. is connected between the gate and the drain of P4 in FIG. 16 to decrease the gain in the high frequency region and suppress the phase rotation, so that the stability is improved. In the canceling signal generation circuit, the frequency characteristics seen from the error amplifier is scarcely influenced. However, only the ripple noise characteristics seen from Vdd have an effect on the operation of the generator. The degree of the effect on said operation is somewhat different, depending on the position of a connecting circuit.

Figure 14:
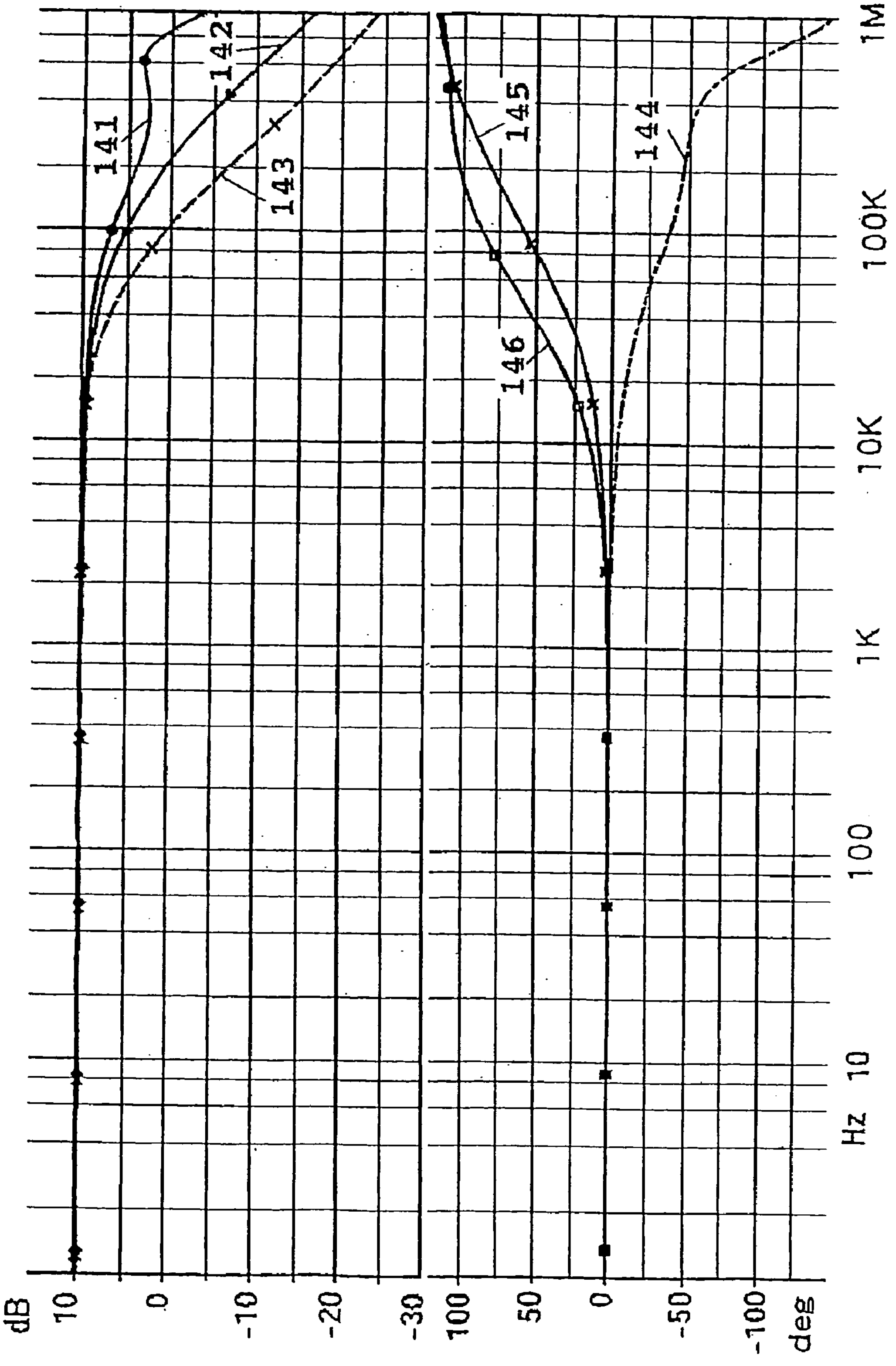
FIG. 14 is a graph showing the working of the canceling signal generation circuit.

In case of the circuit in FIG. 16, where the canceling signal generation circuit 80 is connected to Vdd, there is no similarity with the conventional phase compensation mode, because it has nothing to do with the input of the error amplifier. Next, the canceling signal generation circuit is connected to the location A or B, the gain seen from the error amplifier at the locations A and B is below 1 and has almost no effect. However, almost all of the ripple noise signals on the power source line Vdd are transmitted to these locations, and therefore the canceling effect can be achieved through C4. The locations C and PD have some gain, seen from the input of the error amplifier and the influence of the feedback is exhibited a little. FIG. 14 is a graph showing the gain-frequency and phase-frequency characteristics C4 connected to the location PD. The numerals 141 and 144, 142 and 145, 143 and 146 indicate the gain-frequency and the phase-frequency curve corresponding to C4=0 pF, 0.1 pF, 1 pF, respectively. In case the resistance divisions R3 and R4 are not used for generation of the canceling signal, as described above, it can be realized by C4 with a subtle capacitance below 0.1 pF. In FIG. 14, the gain of the curves 142 and 143 is decreased by adding C4. And, as shown by the curves 145 and 146, the phase is slightly advanced and this change contributes to stability. Thus, it can be said that the stability is not degraded. Namely, in case of said subtle capacitance, the change of the characteristics is negligible as to the stability.

As described above, the canceling signal generation circuit according to the present invention has no or only a negligible small effect for the error amplifier, and differs from the conventional phase compensation as to the operation. It has the effective noise canceling properties to the ripple noise from the supply line Vdd. Therefore, since the noise canceling is added after the conventional phase compensation is sufficiently carried out, it is possible that the stability of the power source circuit is secured and the PSRR is sufficiently improved.

(Example of Canceling Operation)

Example of the cancel operation

Figure 12:
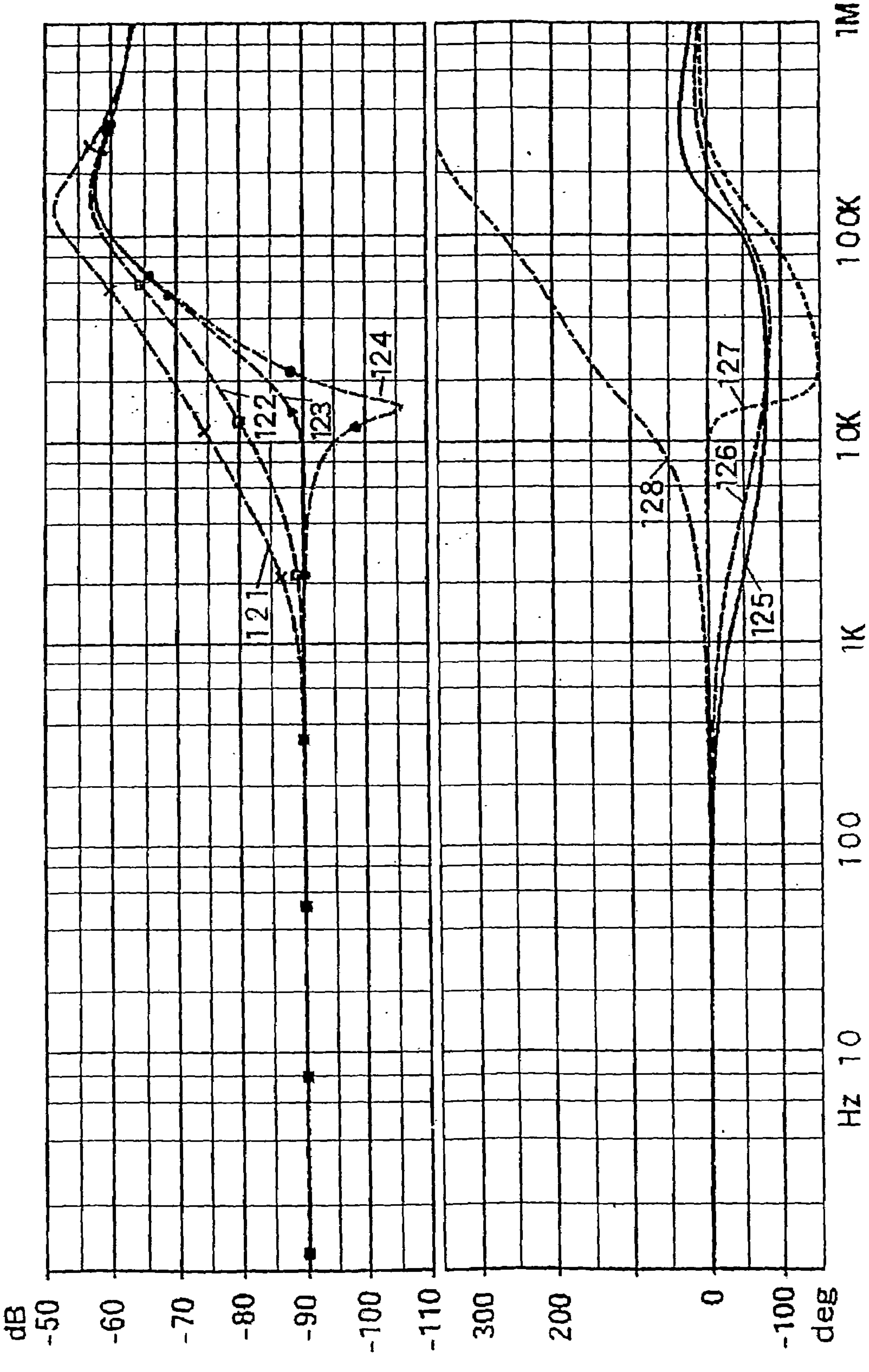
FIG. 12 shows the operation of the canceling signal generation circuit.

FIG. 12 shows the PSRR characteristics where, in the embodiment concerning FIG. 16, the operation current is set to about 1 μA, less than in the previous example, with the capacitor C4 changing from 0 pF to 0.1 pF. The curves 121 and 125, the curves 122 and 126, the curves 123 and 128, the curves 124 and 127 indicate the characteristics corresponding to C4=0 pF, 0.1 pF 0.5 pF, 1.0 pF, respectively. The numeral 125 shows that the phase delay begins around a few 100 Hz, due to the absence of the canceling signal, and the PSRR starts to be degraded around at 1 Khz. The numeral 126 shows that the phase delay moves to the slightly higher frequency and the correction is about to start. The numeral 127 shows the state where the phase cancellation is effected almost perfectly and the phase changes drastically. The numeral 128 shows the phase delay is corrected too much, the phase is advanced, and the PSRR characteristics begin to be degraded.

Such a canceling method is unprecedented, and its effect is apparent and effective at a first glance. In the circuit diagram of FIG. 16, the canceling signal generation circuit is connected to the power source Vdd. Even in case it is connected to another location where there are ripple noises, the same effect can be achieved.

In the embodiment of the present invention, though as an example of the semiconductor element a FET is shown, the equivalent effect can be expected with other types of semiconductor elements, as for example, bipolar transistors, SiGe transistors, thin-film transistors, and GeAs transistors. Therefore, the embodiment is not limited to the FET, further, while the error amplifier with a N-FET input is used in the embodiment of the present invention, it can be easily inferred that this is applied to the error amplifier with a P-FET input.

Effect of the Invention

As described above, according to the present invention, the ripple noise rejection rate and the operation stability, far more excellent than in the prior art, can be realized with very low operating current, without raising the amplification degree and separating the location of the pole by a special method.

The present invention proposes the circuit configuration that does not exist in the prior art and realizes the very effective ripple noise rejection rate by canceling the ripple noise with a small number of components under the condition of very low operating current.

The invention claimed is:

1. A noise canceling circuit, comprising:

a first source terminal;

a second source terminal;

an output terminal;

a reference voltage generator for generating a reference voltage, having an input connected to said first source terminal, and an input connected to said second source terminal, and an output;

a bias current generator for generating a bias current determining an operating current, having a first source input, a second source input, and an output;

a voltage-current generator for generating an output of a power circuit, having a first input connected to said first source terminal, a second input, and an output connected to said output terminal;

a voltage divider for detecting a fluctuation of an output voltage at the output terminal, having an input connected to said second source terminal, an input connected to said output terminal, and an output; and an error amplifier for amplifying an error voltage between said reference voltage and an output voltage from said output of said voltage divider, having an input connected to said first source terminal, an input connected to said second source terminal, an input connected to said output of said reference voltage generator, an input connected to said output of said bias current generator, an input connected to said output of said voltage divider, and an output connected to said second input of said voltage-current generator, wherein said error amplifier comprises an input part, a load part, a noise suppression part, and a phase compensation capacitor, wherein said input part comprises a pair of first type semiconductor elements, wherein said load part comprises a pair of second type semiconductor elements, and wherein said noise suppression part (i) is disposed between said input part and said load part, (ii) has an input connected to said first source terminal, and (iii) comprises a pair of the first type semiconductor elements of different dimension in length or width.

2. A noise canceling circuit according to claim 1, further comprising:

a canceling signal generator containing a capacitance different from said phase compensation capacitor, wherein said capacitance is connected to (i) said output of said voltage-divider, and (ii) the first source terminal or a circuit node changing with a same phase as a voltage at the first source terminal.

3. A noise canceling circuit according to claim 1, further comprising:

a canceling signal generator containing a capacitance different from said phase compensation capacitor, wherein said capacitance is connected to (i) said output of said voltage-divider, and (ii) the first source terminal or a circuit node changing with a same phase as a voltage at the first source terminal.

4. A noise canceling circuit, comprising:

a first source terminal;

a second source terminal;

an output terminal;

a reference voltage generator for generating a reference voltage and generating a bias current determining an operating current, having an input connected to said first source terminal, an input connected to said second source terminal, and a reference voltage output;

a voltage-current generator for generating an output of a power circuit, having a first input connected to said first source terminal, a second input, and an output connected to said output terminal;

a voltage divider for detecting a fluctuation of an output voltage at the output terminal, having an input connected to said second source terminal, an input connected to said output terminal, and an output; and an error amplifier for amplifying an error voltage between said reference voltage and an output voltage from said output of said voltage divider, having an input connected to said first source terminal, an input connected to said second source terminal, an input connected to said reference voltage output, an input connected to said output of said voltage divider, and an output connected to said second input of said voltage-current generator, wherein said error amplifier comprises an input part, a load part, a noise suppression part, and a phase compensation capacitor, wherein said input part comprises a pair of first type semiconductor elements, wherein said load part comprises a pair of second type semiconductor elements, and wherein said noise suppression part (i) is disposed between said input part and said load part, (ii) has an input connected to said first source terminal, and (iii) comprises a pair of the first type semiconductor elements of different dimension in length or width.

* * * * *